United States Patent
Chen

(10) Patent No.: US 8,063,393 B2
(45) Date of Patent: Nov. 22, 2011

(54) MEMORY DEVICES, STYLUS-SHAPED STRUCTURES, ELECTRONIC APPARATUSES, AND METHODS FOR FABRICATING THE SAME

(75) Inventor: Wei-Su Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 262 days.

(21) Appl. No.: 12/205,804

(22) Filed: Sep. 5, 2008

(65) Prior Publication Data
US 2009/0191367 A1  Jul. 30, 2009

(30) Foreign Application Priority Data
Jan. 30, 2008  (TW) .................... 97103446 A

(51) Int. Cl.
H01L 23/48 (2006.01)
H01L 45/00 (2006.01)
H01L 29/82 (2006.01)

(52) U.S. Cl. .......... 257/4; 257/747; 257/E45.002; 257/E29.323; 257/E23.011

(58) Field of Classification Search .............. 257/4, 5, 257/774, E45.002, E29.323, E23.011
See application file for complete search history.

(56) References Cited

U.S. PATENT DOCUMENTS

| | | | |
|---|---|---|---|
| 5,332,722 A | 7/1994 | Fujihira | |
| 5,541,868 A | 7/1996 | Prinz | |
| 6,027,951 A * | 2/2000 | MacDonald et al. | 438/20 |
| 6,815,774 B1 * | 11/2004 | Oi et al. | 257/349 |
| 6,936,484 B2 * | 8/2005 | Kanechika et al. | 438/20 |
| 7,002,839 B2 | 2/2006 | Kawabata et al. | |
| 7,099,185 B2 | 8/2006 | Yamamoto et al. | |
| 7,473,576 B2 * | 1/2009 | Lung | 438/102 |
| 7,579,233 B2 * | 8/2009 | Hwang | 438/239 |
| 7,627,938 B2 * | 12/2009 | Kim et al. | 29/458 |
| 7,830,076 B2 * | 11/2010 | Wittmann et al. | 313/379 |
| 2005/0127348 A1 * | 6/2005 | Horak et al. | 257/3 |
| 2008/0164577 A1 * | 7/2008 | Li et al. | 257/627 |
| 2009/0104771 A1 * | 4/2009 | Lung | 438/666 |
| 2011/0114597 A1 * | 5/2011 | Griffin et al. | 216/18 |

FOREIGN PATENT DOCUMENTS

| | | |
|---|---|---|
| CN | 1901087 | 1/2007 |
| WO | WO 03/017317 A1 | 2/2003 |

OTHER PUBLICATIONS

M.De Vittorio et al.,"Two-dimensional photonic crystal waveguide obtained by e-beam direct writing of SU8-2000 photoresist",Microelectronic Engineering 73-74,pp. 388-391, Elsevier, US.

Richard D. Piner et al., "Dip-Pen Nanolithography", Science vol. 283, Jan. 29, 1999, pp. 661-663, US.

(Continued)

Primary Examiner — Victor A Mandala

(57) ABSTRACT

An exemplary hollow stylus-shaped structure is disclosed, including a hollow column spacer formed over a base layer and a hollow cone spacer stacked over the hollow column spacer, wherein the hollow cone spacer, the hollow column spacer, and the base layer form a space, and sidewalls of the hollow cone spacer and the hollow column spacer are made of silicon-containing organic or inorganic materials.

25 Claims, 15 Drawing Sheets

OTHER PUBLICATIONS

Wei-Su Chen et al. "Gap-Fill Type HSQ/ZEP520A Bilayer Resist Process -(I): HSQ-coated ZEP520A CD Shrinkage for 32nm Trench Patterns", Advances in Resist Materials and Processing Technology XXV, Proceedings of SPIE, vol. 6519-167, Mar. 2007, US.

Wei-Su Chen et al., "Sub-10 nm Contact Holes with Aspect Ratio over Sixty Formed by E-beam Resist Shrinkage Techniques", Advances in Resist Materials and Processing Technology XXIV, Proceedings of the SPIE, vol. 6519, pp. 651945, Mar. 2007, US.

Wei-Su Chen et al., "Gap-Fill Type HSQ/ZEP520A Bilayer Resist Process-(II): HSQ Island and Spacer Formation", Advances in Resist Materials and Processing Technology XXV, Proceedings of the SPIE, vol. 6923, pp. 69232Y-69232Y-9, Apr. 2008, US.

http://www.zyvex.com/EIPBNuG/97MicroHonor.html, 1997.

* cited by examiner

MEMORY DEVICES, STYLUS-SHAPED STRUCTURES, ELECTRONIC APPARATUSES, AND METHODS FOR FABRICATING THE SAME

BACKGROUND OF THE INVENTION

1. Field of the Invention

The invention relates to memory devices, and more particularly to a phase change memory (PCM) device and a method for fabricating the same.

2. Description of the Related Art

Phase change memory devices are non-volatile, highly readable, and highly programmable, and require a relatively lower driving voltage/current. Current trends in phase change memory development are to increase cell density and reduce working currents such as write currents and reset currents thereof.

Phase change material in a phase change memory device has at least two solid phases, a crystalline state and an amorphous state. Transformation between these two phases can be achieved by changing the temperature of the phase change material. The phase change material exhibits different electrical characteristics depending on its state. For example, in its amorphous state the material exhibits a higher resistivity than in the crystalline state. Such phase change material may switch between numerous electrically detectable conditions of varying resistivities within a nanosecond time scale with the input of pico joules of energy. Since phase change material permits reversible phase transformation, memory bit status can be distinguished by determining the phase of phase change material in the memory bit.

FIG. 1 is a schematic diagram showing a cross sectional view of a conventional phase change memory cell structure. As shown in FIG. 1, the phase change memory cell structure includes a silicon substrate 10 with a bottom electrode 12 made of conductive material such as Al or W thereon. A dielectric layer 14 is formed over the bottom electrode 12 and a heating electrode 16 is formed in a portion of the dielectric layer 14. Moreover, a patterned phase change material layer 20 is stacked over the dielectric layer 14. The patterned phase change material layer 20 is formed within a dielectric layer 18 which is formed over the dielectric layer 14 and a bottom surface of the phase change material layer 20, partially contacting the heating electrode 16. A dielectric layer 24 is formed over the dielectric layer 18 and a top electrode 22 is formed over and in the dielectric layer 24. The top electrode 22 partially covers the dielectric layer 24 and portions thereof protrude downward through the dielectric layer 24, thereby contacting the phase change material layer 20 thereunder.

During memory cell operation, a large current is generated by the heating electrode 16 and flows therethrough, thus heating up an interface between the phase change material layer pattern 20 and the heating electrode 16 and thereby transforming a portion (not shown) of the phase change material layer 20 into either the amorphous state or the crystalline state depending on the length of time and amount of current that flows through the heating electrode 16.

Currently, to enhance applications of phase change memory devices, size of the memory cells of the phase change memory devices is being required to be further reduced. With size reduction of the memory cell, however, it also means working current of the memory cells should also be reduced while increasing memory cell density.

One problem found with conventional phase change memory cell structure as shown in FIG. 1, is that the amount of write current and reset current required to successfully change the phase state of the phase change material during cell operation is relatively large. One solution to reduce write current and reset current and to successfully turn on the phase change reaction of the memory cells, is to reduce the contact surface between the heating electrode 16 and the phase change material layer 20, such as through reducing a diameter $D_0$ of the heating electrode 16, thereby maintaining or increasing a current density at the interface.

Reduction of the diameter $D_0$ of the heating electrode 16, however, is limited by current photolithography process ability, thereby limiting size reduction of the heating electrode 16 and ability to decrease working currents such as write current and reset current.

BRIEF SUMMARY OF THE INVENTION

Memory devices, stylus-shaped structures, electronic apparatuses, and methods for fabricating the same are provided.

An exemplary embodiment of a hollow stylus-shaped structure comprises a hollow column spacer formed over a base layer and a hollow cone spacer stacked over the hollow column spacer, wherein the hollow cone spacer, the hollow column spacer, and the base layer form a space, and sidewalls of the hollow cone spacer and the hollow column spacer are made of silicon-containing organic or inorganic materials.

An exemplary embodiment of a method for fabricating a hollow stylus-shaped structure comprises providing a base layer. A resist layer is blanketly formed over the base layer, wherein the resist layer comprises no silicon. The resist layer is defined to form an opening in the resist layer, wherein the opening exposes a portion of the base layer and a sidewall of the resist layer. A spacer layer is conformably formed over a top surface of the resist layer, the sidewall of the resist layer exposed by the opening, and the part of the base layer exposed by the opening, wherein the spacer layer comprises silicon. A thermal process is performed to reflow the resist layer and seal the opening and divide the spacer layer into a first portion and a second portion, wherein the first part of the spacer layer covers the top surface of the resist layer, and the second part of the resist layer is embedded in the resist layer and defines a space in combination with the base layer. The first part of the spacer layer and the first resist layer are sequentially removed to expose the space defined by the second part of the spacer layer in combination with the base layer, wherein the second part of the spacer layer comprises a hollow column spacer and a hollow cone spacer stacked thereof and has a hollow stylus-shaped cross section.

An exemplary embodiment of a phase change memory (PCM) device comprises a hollow stylus-shaped structure as previously described above, wherein the base layer is a first conductive layer. A second conductive layer is conformably formed over a surface of the hollow stylus-shaped structure and portions of the first conductive layer adjacent to the hollow stylus-shaped structure. A first dielectric layer partially covers the second conductive layer to expose the second conductive layer over a tip portion of the hollow cone spacer of the hollow stylus-shaped structure. A phase change material layer is formed over the first dielectric layer to contact with the second conductive layer formed over the tip portion of the hollow cone spacer of the hollow stylus-shaped structure. A third conductive layer is formed over the phase change material layer.

Another exemplary embodiment of a phase change memory (PCM) device comprises a first conductive layer and a plurality of solid pillars formed over the first conductive layer, wherein the solid pillars comprise silicon-containing organic or inorganic materials. A phase change material layer is conformably formed over a surface of the solid pillars. A second conductive layer is formed over a top surface of the phase change material layer. A first dielectric layer is disposed between the solid pillars to cover the first conductive layer and portions of the second conductive layer. A third conductive layer is formed over the first conductive layer and through the first dielectric layer, contacting with the second conductive layer.

An exemplary embodiment of a method for fabricating a phase change memory (PCM) device comprises providing a plurality of the hollow stylus-shaped structures as previously described above, wherein the hollow stylus-shaped structures share a base layer and the base layer is a first conductive layer. A second conductive layer is conformably formed to cover the hollow stylus-shaped structures and the first conductive layer. A first dielectric layer is formed to cover the second conductive layer and leave a substantially planar surface. The first dielectric layer is etched to partially expose the second conductive layer covering a tip portion of the cone spacer of the hollow stylus-shaped structures. A phase change material layer is formed over the first dielectric layer to cover the second conductive layer formed over the tip portion of the hollow cone spacer of the hollow stylus-shaped structures. An opening is formed in the phase change material layer, the first dielectric layer, and the second conductive layer between the hollow stylus-shaped structures to form a plurality of memory cell structures and the opening partially exposes a part of the first conductive layer. A second dielectric layer is formed over the patterned phase change material layer, filling the opening. A plurality of via holes is formed in the second dielectric layer, respectively exposing a part of the patterned phase change material layer of the memory cell structures. A third conductive layer is formed over the second dielectric layer, respectively filling one of the via holes and covering the exposed part of the patterned phase change material layer. The memory cell structures respectively comprises a patterned second conductive layer conformably formed over a surface of the hollow stylus-shaped structure and parts of the first conductive layer adjacent to the hollow stylus-shaped structure, a patterned first dielectric layer partially covering the patterned second conductive layer and exposing the second conductive layer covering the tip portion of the hollow cone spacer of the hollow stylus-shaped structure, and a patterned phase change material layer formed over the first dielectric layer to contact with the second conductive layer covering the tip portion of the hollow cone spacer of the hollow stylus-shaped structure.

An exemplary embodiment of a magnetic random access memory (MRAM) device comprises a hollow stylus-shaped structure as previously described above. The base layer is a first conductive layer, a second conductive layer is conformably formed over a surface of the hollow stylus-shaped structure and parts of the first conductive layer are adjacent to the hollow stylus-shaped structure. A first dielectric layer partially covers the conductive layer and exposes the second conductive layer covering a tip portion of the hollow cone spacer of the hollow stylus-shaped structure. A stacked structure is formed over the first dielectric layer comprising a free layer, a spacer layer, and a pinned layer sequentially stacked over the first dielectric layer and a third conductive layer formed over the stacked structure, wherein the free layer covers the second conductive layer over the tip portion of the hollow cone spacer of the hollow stylus-shaped structure.

An exemplary embodiment of a resistive random access memory (RRAM) device comprises a hollow stylus-shaped structure as previously described above. The base layer is a first conductive layer, a second conductive layer is conformably formed over a surface of the hollow stylus-shaped structure and parts of the first conductive layer adjacent to the hollow stylus-shaped structure. A first dielectric layer partially covers the conductive layer and exposes the second conductive layer covering a tip portion of the hollow cone spacer of the hollow stylus-shaped structure. A metal oxide layer is formed over the first dielectric layer, and a third conductive layer is formed over the stacked structure, wherein the metal oxide layer covers the second conductive layer over the tip portion of the hollow cone spacer of the hollow stylus-shaped structure.

An exemplary embodiment of a field emission display (FED) device comprises a plurality of hollow stylus-shaped structures as previously described above. The hollow stylus-shaped structures shares a base layer and the base layer is a cathode layer formed over a first substrate. A conductive layer is conformably formed over a surface of the hollow stylus-shaped structures and the cathode layer, a second substrate with an anode layer thereon is oppositely disposed to the first substrate, and a plurality of fluorescence layers disposed over the anode layer, substantially aligns to one of the hollow stylus-shaped structures covered by the conductive layer, wherein the conductive layer formed over the hollow stylus-shaped structures are electrically isolated.

An exemplary embodiment of a multiple-electrobeam direct writing lithography apparatus comprises a plurality of hollow stylus-shaped structures as previously described above. The hollow stylus-shaped structures share a base layer and the base layer is a semiconductor layer formed over a support substrate, and a conductive layer is conformably formed over a surface of the hollow stylus-shaped structures and the semiconductor layer, wherein the conductive layer formed over the hollow stylus-shaped structures and the semiconductor layer are electrically isolated.

An exemplary embodiment of a high density magnetic storage device comprises a probe layer, a cantilever connected with the probe layer, a hollow stylus-shaped structure as previously described above formed over an end of the cantilever, wherein the base layer is the cantilever. A conductive layer conformably covers a surface of the cantilever and the hollow stylus-shaped structure, wherein the hollow stylus-shaped structure covered by the conductive layer acts as a writing component.

An exemplary embodiment of a microscope apparatus comprises a Z-axis direction positioning sensor, a cantilever connected with the Z-axis direction positioning sensor, and a hollow stylus-shaped structure as previously described above formed over an end of the cantilever, wherein the base layer is the cantilever. A layer comprising a material selected from the group consisting of SiOx, SiNx, and tungsten conformably covers a surface of the cantilever and the hollow stylus-shaped structure, an X-Y-axis direction positioning sensor, and a substrate disposed over the X-Y-axis direction positioning sensor, wherein the hollow stylus-shaped structure covered by the layer acts as a probe for measuring a surface profile of a sample disposed over the substrate.

An exemplary embodiment of a lithography apparatus comprises a Z-axis direction positioning sensor, a cantilever connected with the Z-axis direction positioning sensor, and a hollow stylus-shaped structure as previously described above formed over an end of the cantilever, wherein the base layer is the cantilever. A layer comprising a material selected from the group consisting of W/ZrOx, W, LaB6, Pt, Au, carbon, and carbon nanotube (CNT) conformably covers a surface of the cantilever and the hollow stylus-shaped structure, an X-Y-axis direction positioning sensor, a substrate disposed over the X-Y-axis direction positioning sensor, having a resist layer formed thereon, and a power supply having a positive terminal connected with the substrate and a negative terminal connected with the layer, wherein the hollow stylus-shaped structure covered by the resist layer acts as an exposing component to pattern the resist layer.

An exemplary embodiment of a photonic crystal structure comprises a substrate; and a plurality of hollow stylus-shaped structures as previously described above formed over the substrate, wherein the hollow stylus-shaped structures are arranged with a substantially same pitch therebetween and sidewalls of the hollow stylus-shaped structures are composed of silicon-containing organic or inorganic materials.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Embodiments of the invention are described as below incorporating FIGS. 2-27. FIGS. 2~6 are schematic diagrams respectively showing fabrications in various fabrication steps of a stylus structure according to an embodiment of the invention. FIGS. 7~11 are schematic diagrams respectively showing fabrications in various fabrication steps of a phase change memory device according to an embodiment of the invention. FIGS. 12~18 are schematic diagrams memory devices, electronic apparatuses, fabrication systems, and phonic crystal structures according various embodiments of the invention that respectively use the hollow stylus-shaped structure illustrated in FIG. 6. FIGS. 19~25 are schematic diagrams respectively showing fabrications in various fabrication steps of a phase change memory device according to another embodiment of the invention.

Figure 2:
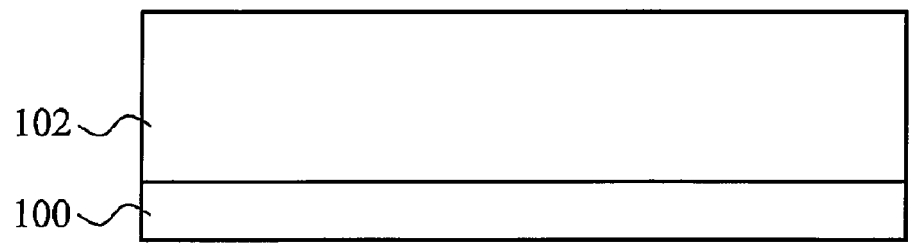
FIGS. 2~6 are schematic diagrams respectively showing fabrications in various fabrication steps of a stylus structure according to an embodiment of the invention.

In FIG. 2, a base layer 100, for example a conductive layer, a dielectric layer, or a part of a substrate, is provided. A resist layer 102 is then coated over the base layer 110. The resist layer 102 comprises resist materials containing no silicon, such as chain scission resists which can be exposed by electro beam (E-beam) exposure or ion beam exposure, or chemically amplified resist (CAR) which can be exposed by deep ultraviolet (DUV) light or E-beam. Herein, the resist layer 102 can be a ZEP-520A resist (a product of Zeon chemicals.) and is not limited thereto. The resist layer 102 is coated with a thickness about 500~10000 Å.

Figure 3:
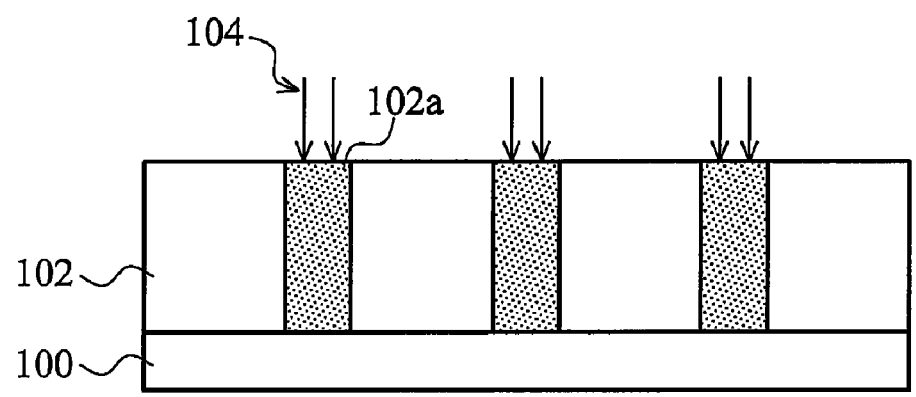

In FIG. 3, an electron beam 104 is provided to directly expose a portion of the resist layer 102, thereby forming a plurality of exposed portions 102a in the resist layer 102. It's noted that while the resist layer 102 adopts resist materials of other exposure types, the resist layer 102 can be exposed in other methods such as a DUV exposed method and is not limited to the electro beam method.

Figure 4:
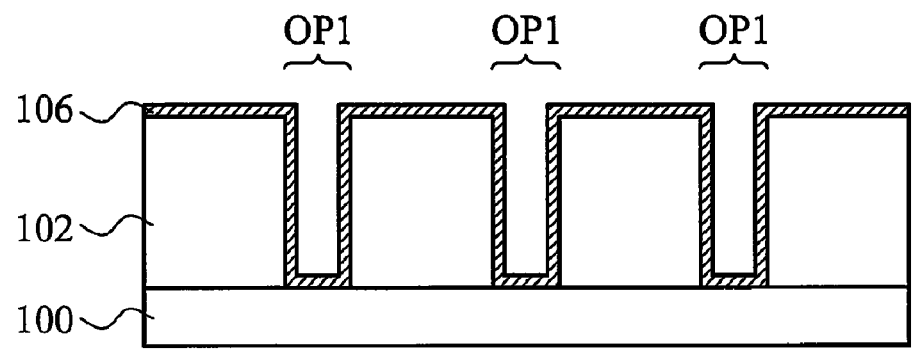

In FIG. 4, a development process (not shown) is performed to remove the exposed portions 102a in the resist layer 102, thereby forming a plurality of opening OPI in the resist layer 102. Each of the opening OPI exposes a part of the base layer 100. Next, a spacer layer 106 is spin coated over a surface of the resist layer 102, and sidewalls of the resist layer 102 exposed by the opening OPI under a rotational speed of about 2000 rpm. Herein, the spacer layer 106 also conformably covers a surface of the base layer 100 exposed by the openings OPI. The spacer layer 106 may comprise diluted silicon-containing material such as silicon-containing organic or inorganic materials. In this embodiment, the diluted silicon-containing material of the spacer layer 106 comprises hydrogen silsesquixane (HSQ) diluted by methyl isobutyl ketone (MIBK). Herein, a ratio of MIBK and HSQ for forming the spacer layer 106 is preferably higher than 3:1 to benefit formation of the spacer layer 106. The spacer layer 106 is formed with a thickness not more than 25 nm.

Figure 5:
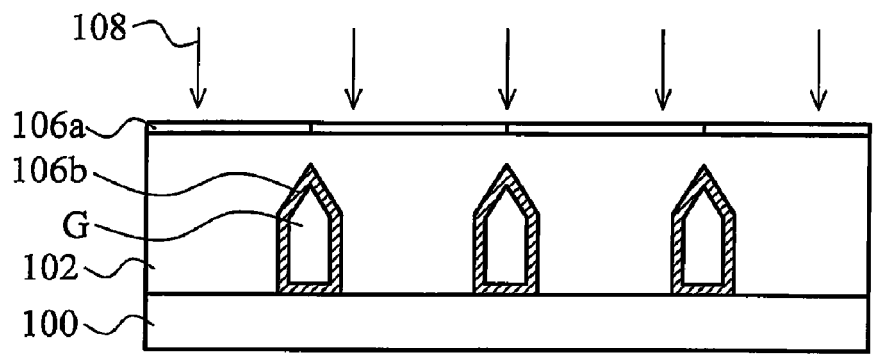

In FIG. 5, the structure illustrated in FIG. 4 is then subjected to a thermal process 108 performed under a temperature of about 140~200° C. to reflow the resist layer 102 and seal the opening OPI formed in the resist layer 102. As shown in FIG. 5, the spacer layer 106 is divided into a first part 106a formed over the surface of the resist layer 102 and a second part 106b embedded in the resist layer 102 after the thermal process 108. Herein the previously formed openings OPI are sealed and become space G with a substantially stylus-shaped configuration. The surface of the space G is covered and sealed by the second part 106b of the spacer layer 106.

Figure 6:
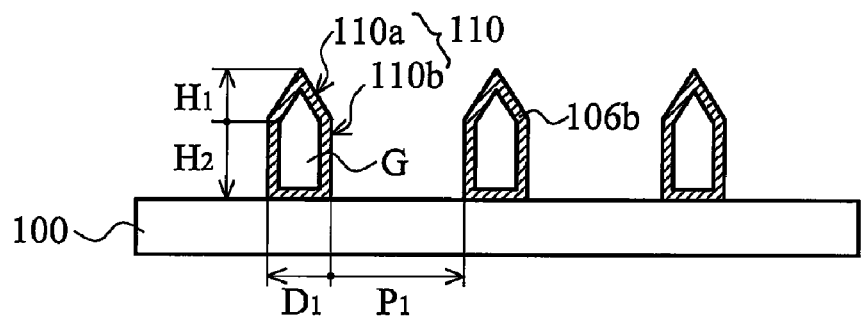

In FIG. 6, a dry etching process (not shown) is next performed to remove the first part 106a of the spacer layer 106 by using a plasma comprising $C_2F_6$ and expose the resist layer 102. Next, another dry etching process (not shown) is performed to entirely remove the resist layer 102 by using a plasma comprising $O_2$ and leave a plurality of hollow stylus-shaped structures 110 over the base layer 100.

As shown in FIG. 6, the hollow stylus-shaped structures 110 are formed by encapsulating the spaces G by the second part 106b of the spacer layer 106 and are substantially defined into two parts, including a first part 110b with a substantially hollow column configuration and a second part 110a with a substantially cone configuration stacked over the first part 110b. The first part 110b is formed with a fixed diameter $D_1$ and has a substantially circular configuration from a top view (not shown). The second part 110a is formed with a varied non-fixed diameter, reduced from a bottom to a top thereof and has a substantially circular configuration from a top view (not shown). The hollow stylus-shaped structures 110 illustrated in FIG. 6 are arranged as a configuration with same pitches therebetween and the diameter $D_1$ of the first part 110b thereof may be 300~2000 Å and a tip portion at an upper portion of the second part 110a thereof may have a minimum diameter less than 100 Å. A height $H_2$ of the first part 110b of the hollow stylus-shaped structures 110 and a height $H_1$ of the second part 110a of the hollow stylus-shaped structures 110 may have a ratio of about 1:1~4:1 therebetween.

The hollow stylus-shaped structures 110 illustrated in FIG. 6 can be applied as components of electrical products such as contact structures in memory devices, electro emission structures in field emission display devices or in electron beam lithography apparatuses, and scanning components in microscope apparatus such as atomic force microscope or scanning tunneling microscope based apparatuses. Embodiments of the hollow stylus-shaped structures 110 illustrated in FIG. 6 used in electrical products are described as below to illustrate applications thereof.

FIGS. 7~11 are schematic diagrams respectively showing fabrications in various fabrication steps of an exemplary phase change memory (PCM) device. Herein, the PCM device adopts the hollow stylus-shaped structures 110 illustrated in FIG. 6.

Figure 7:
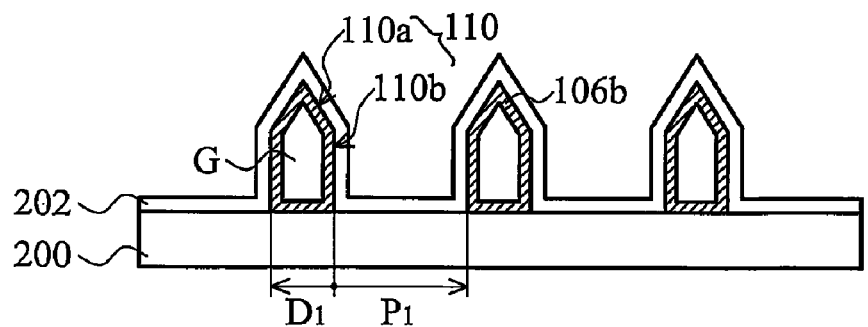
FIGS. 7~11 are schematic diagrams respectively showing fabrications in various fabrication steps of a phase change memory device according to an embodiment of the invention.

In FIG. 7, a conductive layer 200 of, for example, titanium tungsten is first provided. Additional layers or substrate can be further provided under the conductive layer 200 but only the conductive layer 200 is illustrated in FIG. 7, for simplicity. A plurality of hollow stylus-shaped structures 110 as illustrated in FIG. 6 are formed over the conductive layer 200 and formation of the hollow stylus-shaped structures 110 is the same as that illustrated in FIGS. 2~6. A conductive layer 202 is then conformably formed to respectively cover surfaces of the hollow stylus-shaped structures 110 and the conductive layer 200. The conductive layer 202 may comprise metal materials such as TiN or TaN or phase change materials such as chalcogenide materials like Ge—Sb—Te trinary chalcogenide compound or Te—Sb binary chalcogenide compound, or a single layer comprising chalcogenide materials such as Ge—Sb—Te trinary chalcogenide compound or Te—Sb binary chalcogenide compound.

Figure 8:
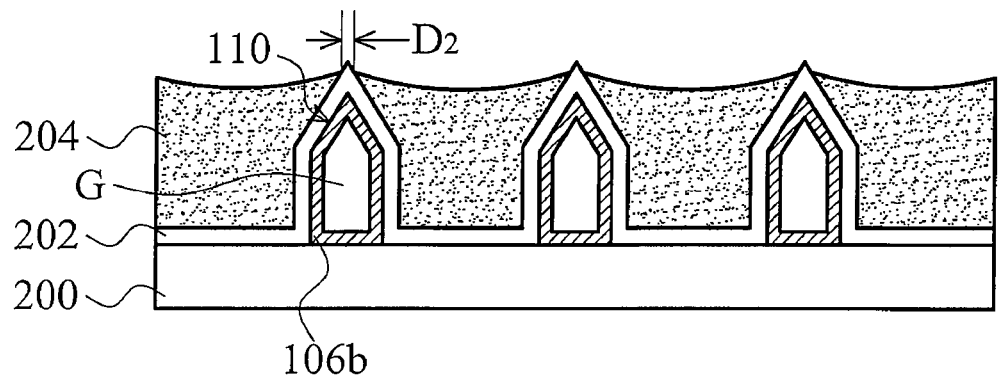

In FIG. 8, a dielectric layer 204 is formed, having a thickness of about 3000~4000 Å, to blanketly cover the conductive layer 202 and the hollow stylus-shaped structures 110, thereby leaving a substantially planar surface. The dielectric layer 204 may comprise materials such as undiluted HSQ and can be formed by, for example, a spin coating process. The dielectric layer 204 formed by a spin coating process, is preferably formed under a rotational speed of about 2000~6000 rpm, and more preferably under a rotational speed of about 2000~3000 rpm. Next, an etching process (not shown) is performed to partially remove the dielectric layer 204 and partially expose the portion of the second conductive layer 202 covering each second part 110b of the hollow stylus-shaped structures 110. The above etching process can be, for example, a wet etching process using highly diluted HF solution (with an HF:water dilution ratio of more than 1:100). At this time, the portion of the conductive layer 202 exposed by the dielectric layer is formed with a diameter $D_2$ which can be controlled by the etching time or the concentration of the HF solution performed in the above etching process. The diameter $D_2$ is preferably about 5~80 nm to reduce a contact area between the conductive layer 202 and sequentially formed components (not shown). Herein, an optional dielectric oxide layer (not shown) can be provided over the conductive layer 202 and the hollow stylus-shaped structures 110 prior to formation of the dielectric layer 204 to prevent collapse of the hollow stylus-shaped structures 110 during formation of the dielectric layer 204. Methods for forming the above dielectric oxide layer can be, for example, a plasma enhanced chemical vapor deposition (PECVD) or high density plasma chemical vapor deposition (HDP CVD) method. In addition, the above etching process can be a dry etching process with a relatively high etching rate for removing a relatively thick part of the dielectric layer 204 (leaving a top surface of the dielectric layer 204 of about 30~50 nm to the conductive layer 202 at a tip portion of the hollow stylus-shaped structures 110) in combination with a sequential wet etching process using HF solution with a relatively low etching rate for removing a relatively thin part of the dielectric 204 till the conductive 202 at the tip portion of the hollow stylus-shaped structures 110 is exposed. In addition, the above etching process can be a repeated dry etching process with a relatively low etching rate (~10 nm per time) for cyclic removing a relatively thick part of the dielectric layer 204 till the conductive 202 at the tip portion of the hollow stylus-shaped structures 110 is exposed. For example, the repeated times for dry etching dielectric layer 204 of 100 nm is 10.

As shown in FIG. 8, the conductive layer 202 over the tip portion of the hollow cone spacer of the hollow stylus-shaped structures 110 substantially has a top view diameter of about 5~100 nm.

Figure 9:
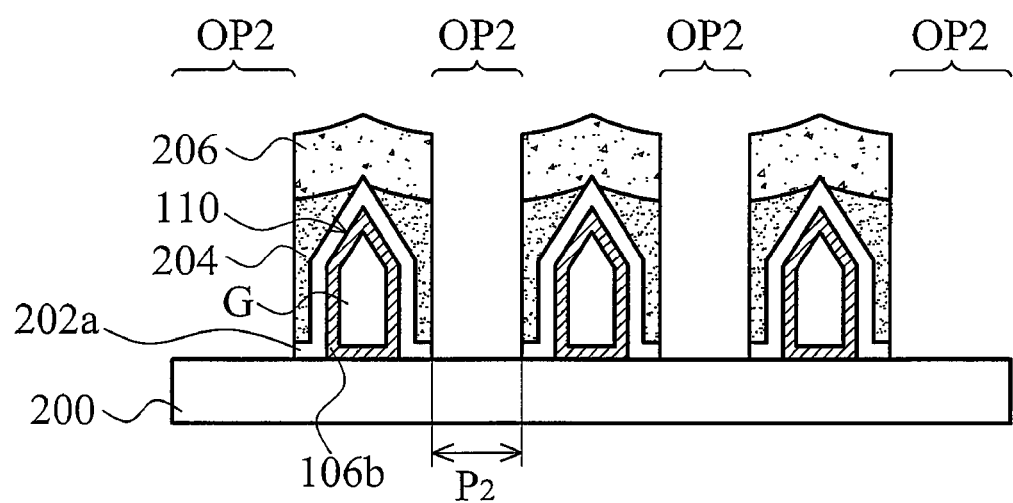

In FIG. 9, a phase change material layer 206 is next formed. The phase change material layer 206 can be formed as a multiple layer comprising an etch hardmask of materials such as SiN, TiW, TaNx or other suitable materials and a layer of phase change materials such as chalcogenide materials like Ge—Sb—Te trinary chalcogenide compound or Te—Sb binary chalcogenide compound, or a single layer comprising chalcogenide materials such as Ge—Sb—Te trinary chalcogenide compound or Te—Sb binary chalcogenide compound. Herein, the conductive layer 202 exposed by the dielectric layer 204 physically contacts the phase change materials in the phase change material layer 206. Next, a photolithography and an etching process (both not shown) are then performed to define portions of the phase change material layer 206, the dielectric layer 204, and the conductive layer 202, thereby forming a plurality of opening OP2 in the film layers between the hollow stylus-shaped structures 110 and forming a plurality of phase change memory (PCM) cell structures. The PCM cell structures are formed with a pitch $P_2$ therebetween of about greater than 1.5 times that of the diameter $D_1$. During the previously described above etching processes, a portion of the conductive layer (not shown) is also etched to ensure insulation between these PCM cell structures. The opening $OP_2$ are formed with a pitch of about 200~5000 Å and the pitch therebetween is decided according the designed cell density of the PCM device.

Figure 10:
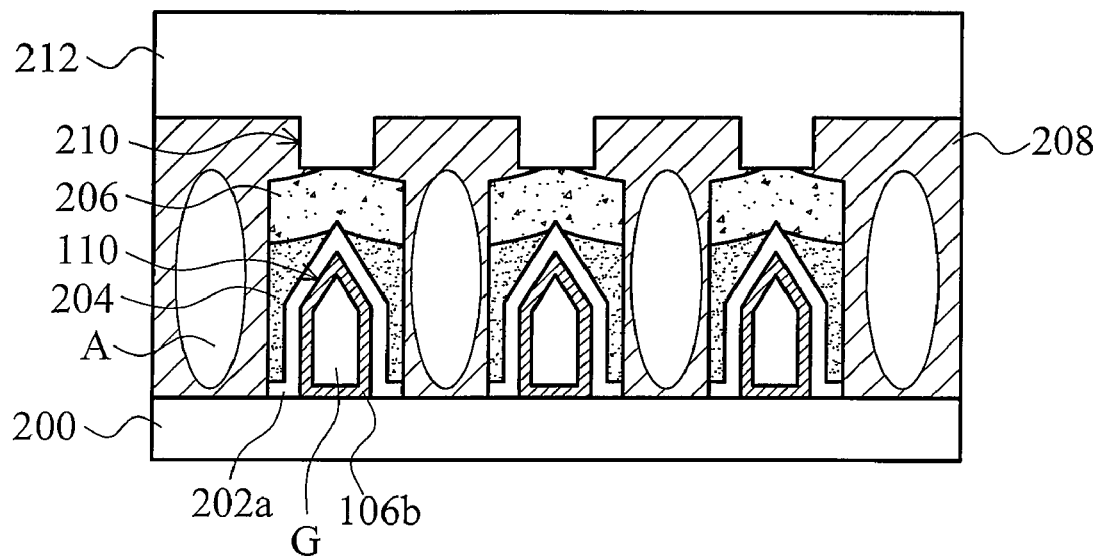

In FIG. 10, an interlayer dielectric layer 208 is blanketly formed over the structure illustrated in FIG. 9. The interlayer dielectric layer 208 can be formed by, for example, plasma enhanced chemical vapor deposition performed under a temperature not more than 350° C. The interlayer dielectric layer 208 may comprise, for example, silicon oxide, silicon nitride, or combination thereof. Herein, air gaps A are simultaneously formed during deposition of the interlayer dielectric layer 208 since an aspect ratio between the phase change memory cell structures is greater than 1. Next, a photolithography and an etching process (both not shown) are performed to form a plurality of via holes 210 in the interlayer dielectric layer 208 and the via holes located at each of the PCM cell structure, respectively, exposing a top surface of the phase change material layer 206. A conductive layer 212 is then blanketly deposited to cover the interlayer dielectric layer 208. The conductive layer 212 may comprise aluminum and a barrier layer (not shown) can be optionally provided between the conductive layer and the interlayer dielectric layer 208. The barrier layer may comprise materials such as TiN or TaN.

Figure 11:
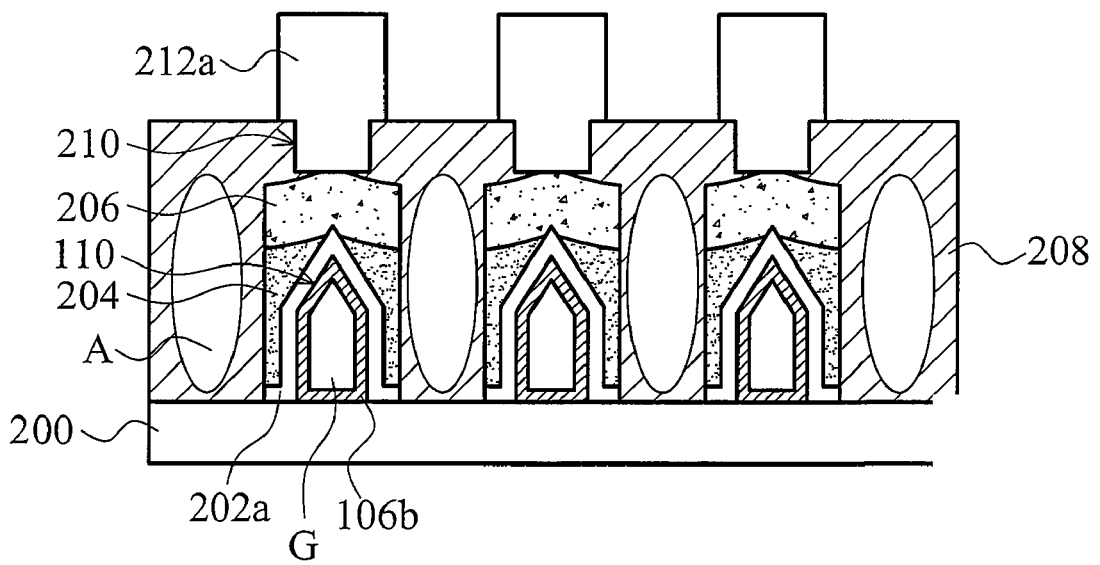

In FIG. 11, a photolithography and an etching process (both not shown) are performed to partially remove the conductive layer 212 and leave a plurality of conductive elements 212 over the PCM cell structures, respectively contacting the phase change material layer 206.

In the PCM device as shown in FIG. 11, the conductive layer (e.g. the conductive layer 202a) covering the tip portion of the hollow stylus-shaped structures in each of the PCM cell structure functions as a heating electrode and a contact area between the heating electrode and the phase change material layer can be thus reduced, thereby lowering operation currents and maintaining current density of the PCM device. In addition, since the stylus-shaped structures under the conductive layer 202a are formed with a hollow interior and the interlayer dielectric layer 208 adjacent thereto is formed with air gaps A therein, the phase change material layer 206 is thereby provided with heat insulation during heating thereof, improving heating efficiency of the heating electrode, and preventing heat diffusion within the PCM cell structures.

Applications of the hollow stylus-shaped structures are not limited by the PCM device as illustrated in FIG. 11 and the hollow stylus-shaped structures can be also applied in other memory devices, electronic apparatuses and manufacturing equipments. FIGS. 12-18, 26 and 27 are schematic diagrams respectively showing various applications of the hollow stylus-shaped structures illustrated in FIG. 6.

Figure 12:
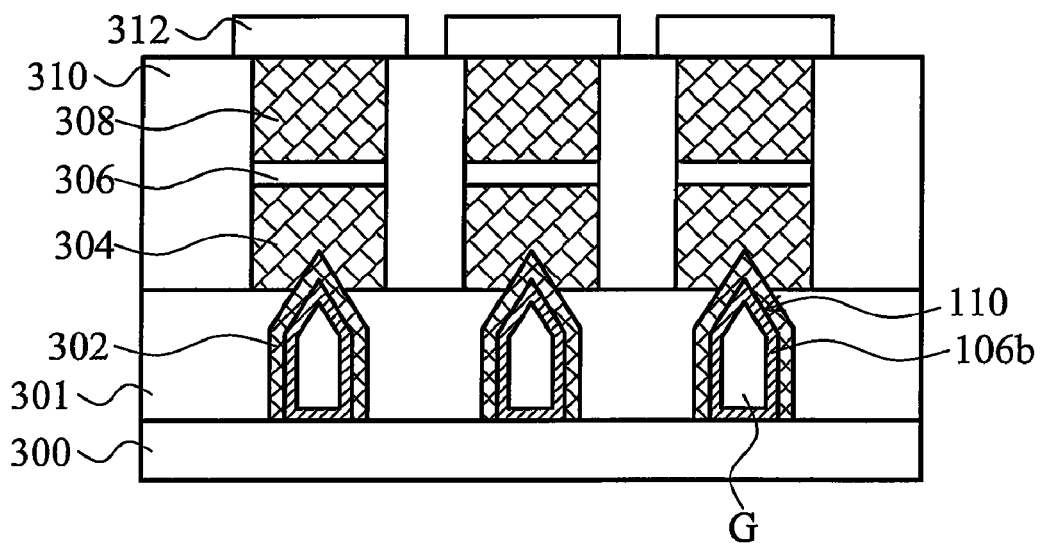
FIG. 12 is a schematic diagram showing a magnetic random access memory (MRAM) device according to an embodiment of the invention.

FIG. 12 is a schematic diagram showing an exemplary magnetic random access memory (MRAM) device. As shown in FIG. 12, the MRAM device comprises a conductive layer 300. Additional layers or substrate can be further provided under the conductive layer 300 but only the conductive layer 300 is illustrated in FIG. 12, for simplicity. A dielectric layer 301 is formed over the conductive layer 300. A plurality of hollow stylus-shaped structures 110 as illustrated in FIG. 6 are embedded in the dielectric layer 301, having a part protruding over the dielectric layer 301. A conductive layer 302 is formed to cover each of the hollow stylus-shaped structures 110. A dielectric layer 310 is formed over the dielectric layer 301, having a plurality of MRAM cell structures formed therein. Each of the MRAM cell structures comprises a free layer 304, a spacer layer 306 and a pinned layer 308 sequentially stacked over the dielectric layer 301. An electrode layer 312 is formed over the pinned layer 310 to connect with the pinned layer 310. Herein, the free layer 304 may comprise material such as CoFeB, CoFe or a stacked layer of NiFe/CoFe, and the spacer layer 306 may comprise materials such as aluminum oxide or magnesium oxide, and the pinned layer 308 may comprise materials such as CoFeB, CoFe CoFeNi or a stacked layer of NiFe/CoFe.

In the MRAM device as shown in FIG. 12, the conductive layer (e.g. the conductive layer 302) covering the tip portion of the hollow stylus-shaped structures 110 in each of the MRAM cell structures functions as a conductive electrode and a contact area between the conductive component and the free layer 304 can be thus reduced, thereby lowering operation currents and maintaining current density of the MRAM device, thus benefiting size reduction of the MRAM device.

Figure 13:
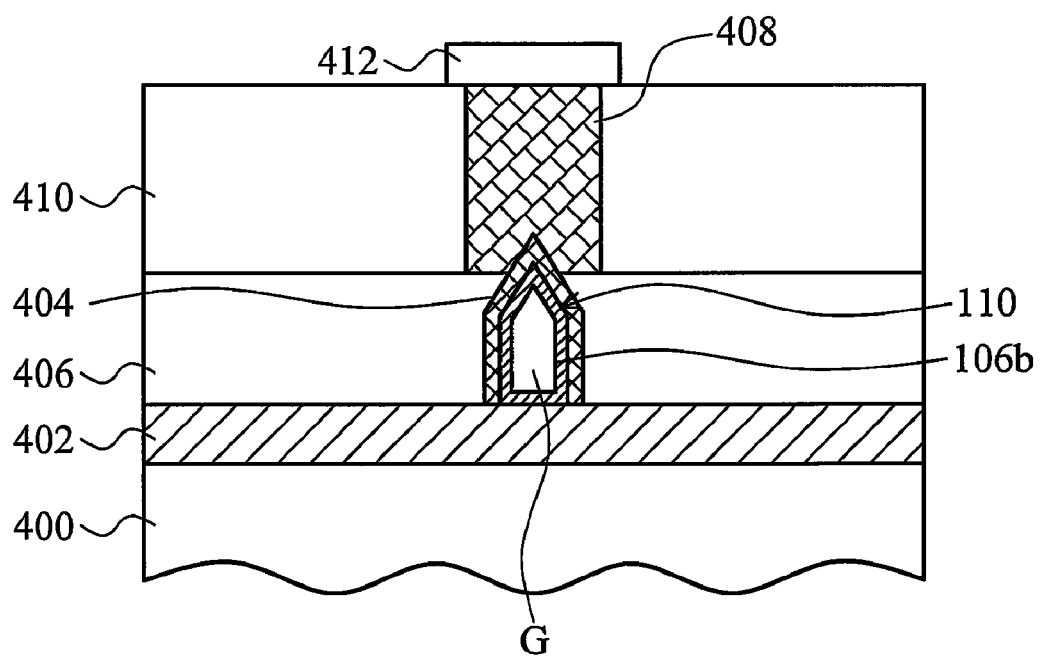
FIG. 13 is a schematic diagram showing a resistive random access memory (RRAM) device according to an embodiment of the invention.

FIG. 13 is a schematic diagram showing an exemplary resistive random access memory (RRAM) device. As shown in FIG. 13, the RRAM device comprises a dielectric layer 400 and a conductive layer 402 formed thereon. A plurality of hollow stylus-shaped structures 110 as illustrated in FIG. 6 are formed over the conductive layer 402 and are partially covered by a dielectric layer 406 formed thereon, thereby forming protruding parts of a conductive layer 404 formed on surfaces of the hollow stylus-shaped structures 110. Thus, a part of the conductive layer 404 is exposed by the dielectric layer 406. A dielectric layer 410 is formed over the dielectric layer 406 and a metal oxide layer 408 is embedded therein. An electrode layer 412 is formed over the dielectric layer and is connected with the metal oxide layer 408. The metal oxide layer 408 may comprise materials such as Ti-doped NiOx, CuOx, FeOx, ZnFexOy, or GdOx.

In the RRAM device as shown in FIG. 13, the conductive layer (e.g. the conductive layer 404) covering the tip portion of the hollow stylus-shaped structures 110 in each of the MRAM cell structures functions as a conductive electrode and a contact area between the conductive component and the metal oxide layer 408 can be thus reduced, thereby lowering operation currents and maintaining current density of the RRAM device, thus benefiting size reduction of the RRAM device.

Figure 14:
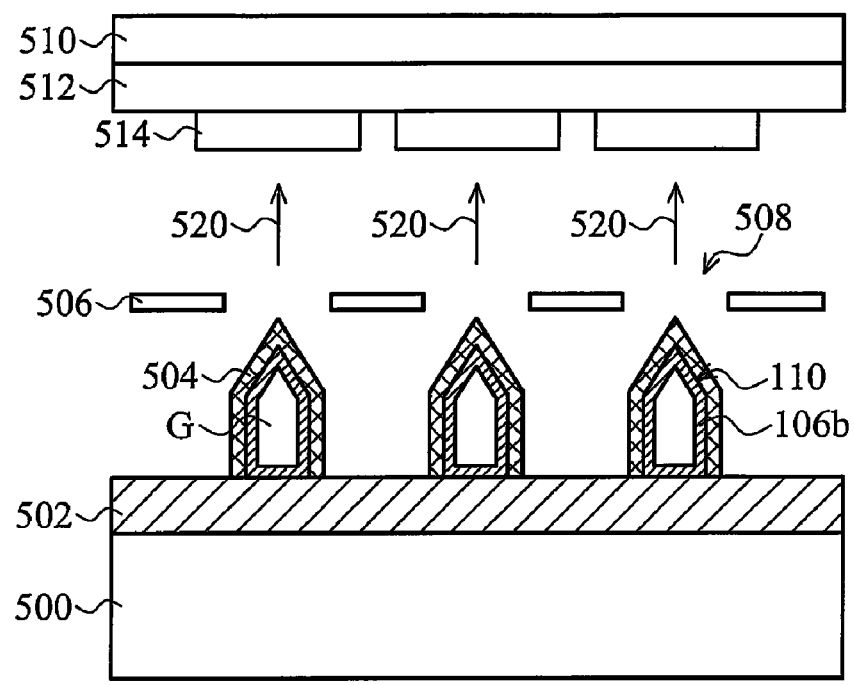
FIG. 14 is a schematic diagram showing a field emission display according to an embodiment of the invention.

FIG. 14 is a schematic diagram showing an exemplary field emission display (FED) device. The FED device comprises a first substrate 500 and a cathode layer 502 formed over the first substrate 500. A plurality of hollow stylus-shaped structures 110 as illustrated in FIG. 6 are formed over the cathode layer 502 and are covered with a conductive layer 504 thereon to benefit electron emission thereof. Herein, the conductive layer 504 only partially covers portions of the surface of the cathode layer 502 and the conductive layer 504 covering each of the hollow stylus-shaped structures 110 are electrically insulated from each other.

In addition, an insulating layer 506 with a plurality of openings 508 therein is formed over the hollow stylus-shaped structures 110. Each of the openings 508 is substantially aligned to one of the hollow stylus-shaped structures 110 to benefit electron emission thereof. Moreover, the FED device comprises a second substrate 510 with an anode layer 512 formed thereon. A plurality of patterned fluorescence layers for showing colors such as red, blue, or green is disposed over the anode layer 512, substantially aligning to one of the hollow stylus-shaped structures 110 covered by the conductive layer 504.

Figure 15:
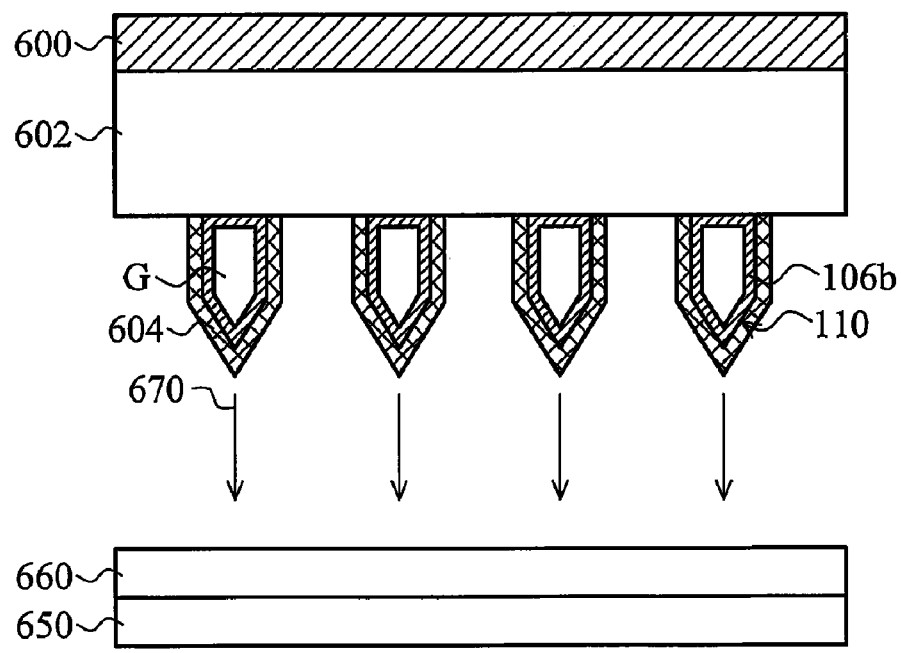
FIG. 15 is a schematic diagram showing a multi-electro-beam direct writing lithography apparatus according to an embodiment of the invention.

FIG. 15 is a schematic diagram showing an exemplary multiple-electrobeam direct writing lithography apparatus. The multiple-electrobeam direct writing lithography apparatus as shown in FIG. 15 is substantially the same as that disclosed in the international patent application WO 03/017317 which is about a photolithography apparatus using MAPPER LITHOGRAPHY system. Herein, only components different from that in the above patent application are disclosed in FIG. 15, for simplicity.

As shown in FIG. 15, a field emitter array is substantially illustrated, comprising a support substrate 600. The support substrate may comprise materials of low absorption under a wavelength of photon beams emitted to the support substrate 600. A semiconductor layer 602 is formed on the support substrate 600 and a plurality of the hollow stylus-shaped structures 110 are formed over the semiconductor layer 602. A conductive layer 604 is formed to cover surfaces of each of the hollow stylus-shaped structures 110 and the conductive layers 604 formed over the hollow stylus-shaped structures 110 are electrically insulated from each other. The conductive layer 604 may comprise materials such as ZrOx/W, W, LaB$_6$, Pt, Au, carbon, or carbon nano tube (CNT).

Thus, photons traveling and penetrating the support substrate 600 generate free electrons when arriving at the semiconductor layer 602 and the free electrons may leave the semiconductor layer 600 from the conductive layer 604 covering the tip portion of the hollow stylus-shaped structures 110, thereby emitting accelerated electrons (not shown) toward a wafer 650 under an external magnetic field 670, and exposing a resist layer 660 formed over the wafer 650. The magnetic field 670 applied between the semiconductor layer 602 and the wafer 650 is preferably a parallel electrical field. Additional two electron splitters in perpendicular direction and beam blanker MEMS structures can be further provided to control the electron beams to emit or not to emit to the resist layer 660 or a position emitted thereto, thereby allowing formation of a pattern on the resist layer 660.

Figure 16:
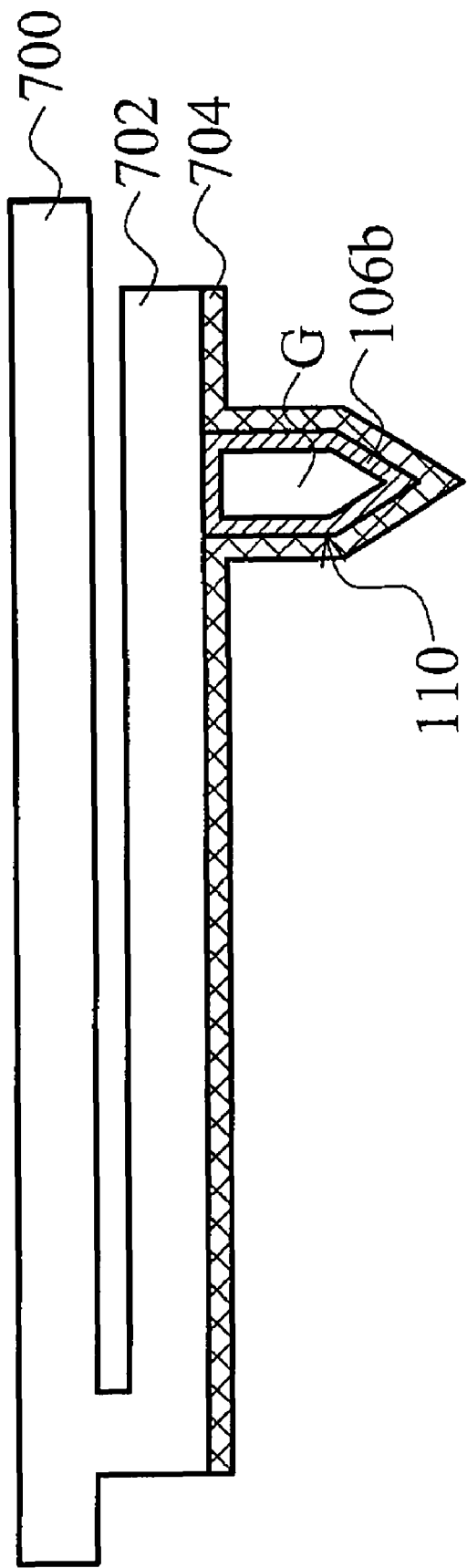
FIG. 16 is a schematic diagram showing a high density magnetic storage device according to an embodiment of the invention.

FIG. 16 is a schematic diagram showing an exemplary high density magnetic storage device. The high density magnetic storage device as shown in FIG. 16 is similar to a high density magnetic storage device using MILLIPEDE storage techniques of IBM as disclosed U.S. Pat. No. 6,680,808. Herein, only a probe layer 700 and a cantilever 702 connected thereto are disclosed for illustration. The probe layer 700 of the high density magnetic storage device as shown in FIG. 16 may be connected with thousands of the above cantilevers 702 and other components thereof may be the same as that of the high density magnetic storage device disclosed in the U.S. Pat. No. 6,680,808.

As shown in FIG. 16, a hollow stylus-shaped structure as disclosed in FIG. 6 is formed at an end of the cantilever 702 and a conductive layer 704 is formed over a surface of the cantilever 702. Herein, the hollow stylus-shaped structure 110 covered by the conductive layer 704 may function as a writing component for data writing.

Figure 17:
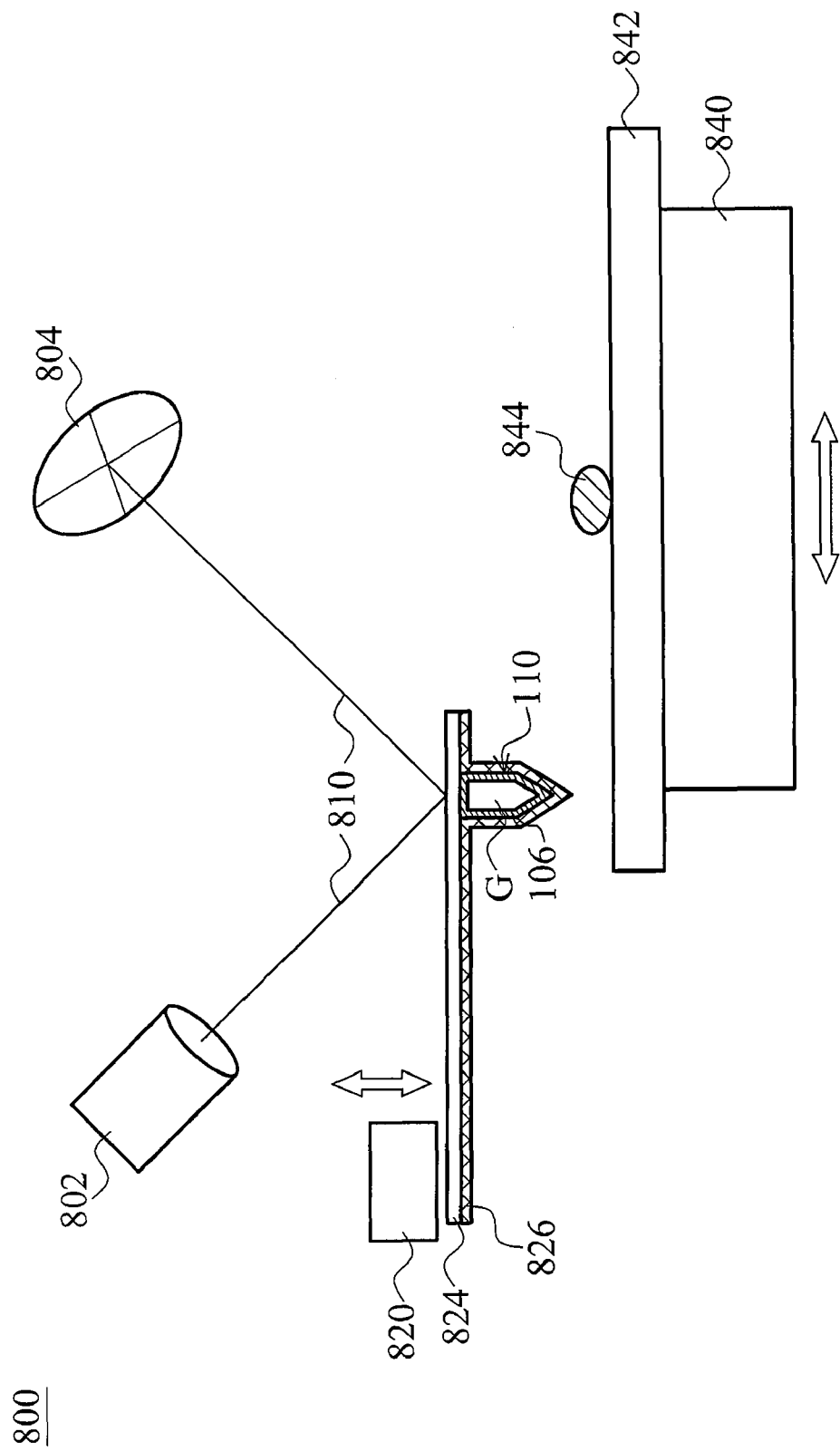
FIG. 17 is a schematic diagram showing a microscope apparatus according to an embodiment of the invention.

FIG. 17 is a schematic diagram showing an exemplary microscope apparatus 800 applicable in atomic force microscope (AFM) or scanning tunneling microscope (STM) based apparatuses. The apparatus 800 as shown in FIG. 17 is applicable as an AFM apparatus, comprising a Z-axis positioning sensor 820 connected with a cantilever 824 and a hollow stylus-shaped hollow structure 110 formed at an end thereof. In addition, a layer 826 is coated over the cantilever 824 and cover surfaces of the hollow stylus-shaped hollow structure 110, thereby forming a probe. The layer 826 may comprise materials such as SiOx, SiNx, metal materials such as W or inks layers provided by NanoINK for Dip Pen lithography.

In addition, the apparatus 800 also comprises an X-Y axis positioning sensor 840 and a substrate 842 is disposed over the X-Y axis positioning sensor 840. A sample 844 can be provided over the substrate 842 and a surface profile thereof can be thus measured by the previously described above probe. Additionally, the apparatus 800 comprises a laser source to emit a laser beam 810 to the probe over the cantilever 824 and a reflected laser beam 810 from the probe is then sensed by an optoelectronic sensor 804.

Herein, the microscope apparatus 800 in FIG. 15 is also applicable as a scanning tunneling microscopy (STM) apparatus by replacing the SiOx or SiNx materials used in the probe therein by materials such as metal.

Figure 18:
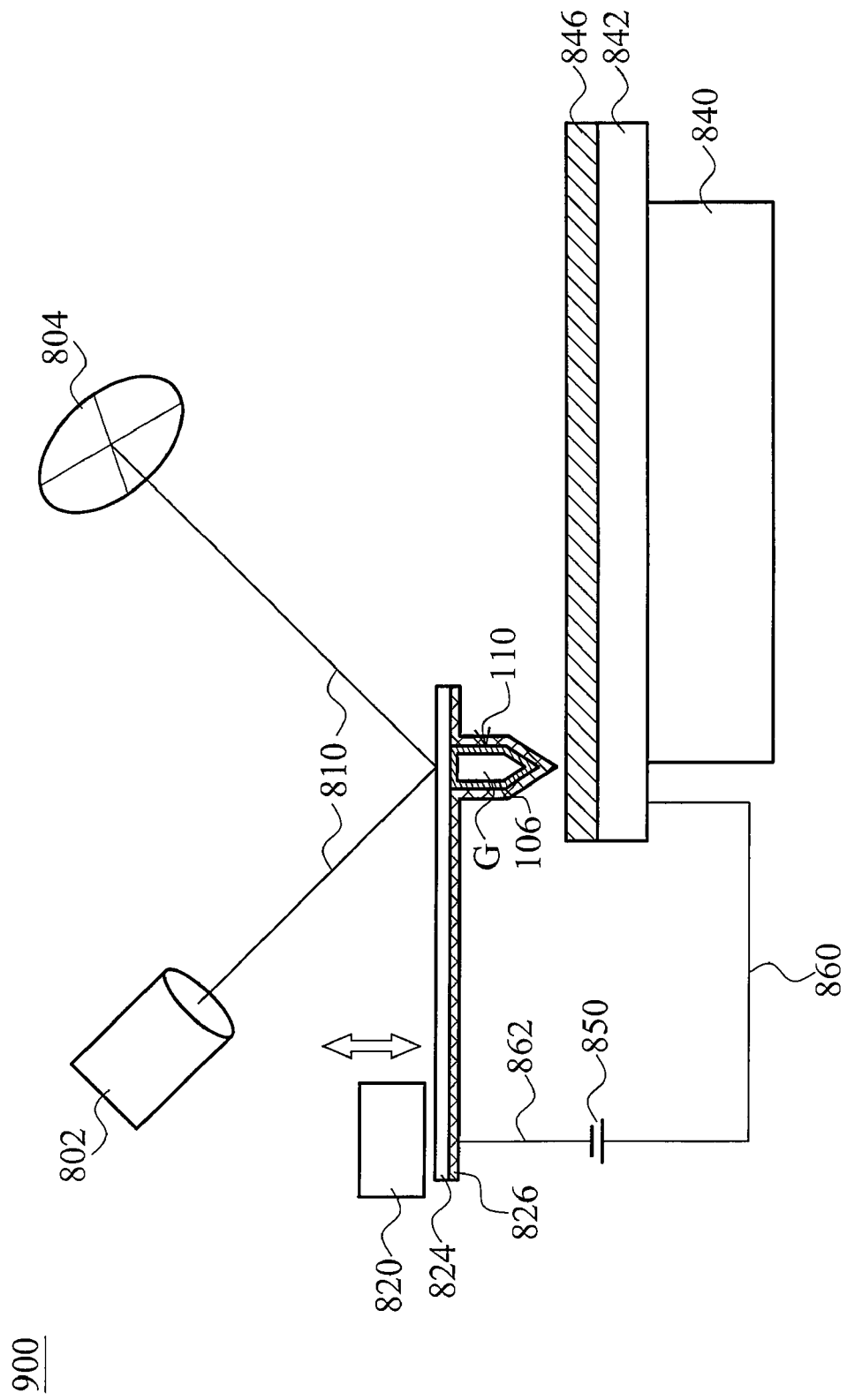
FIG. 18 is a schematic diagram showing a lithography apparatus according to an embodiment of the invention.

FIG. 18 is a schematic diagram showing an exemplary lithography apparatus 900. The lithography apparatus 900 is modified from the AFM apparatus 800 illustrated in FIG. 17 and may have similar components therewith. Only differences between the lithography apparatus 900 and the AFM apparatus 800 are disclosed here. As shown in FIG. 18, the substrate 842 is coated with a resist layer 846 and a power supply is disposed between the substrate 842 and the cantilever 824. Herein, a positive terminal of the power supply 850 is connected to the substrate 842 through a wire 860 and a negative terminal of the power supply 850 is connected to the layer 826 formed over the cantilever 824 through a wire 862. The layer 826 in this embodiment may comprise, for example, W/ZrOx, W, LaB6, Pt, Au, carbon, or carbon nanotube (CNT), thereby forming an exposure component for patterning the resist layer 846.

The lithography apparatus 900 illustrated in FIG. 18 can be applied in lithography techniques such as the so-called "Dip-Pen nanolithography" and the related lithography techniques are disclosed in U.S. Pat. No. 6,642,129 and on the website of nanoINK inc. (http://www.nanoink.net/). Detailed components and operations of the lithography apparatus 900 are not described here, for simplicity.

Figure 26:
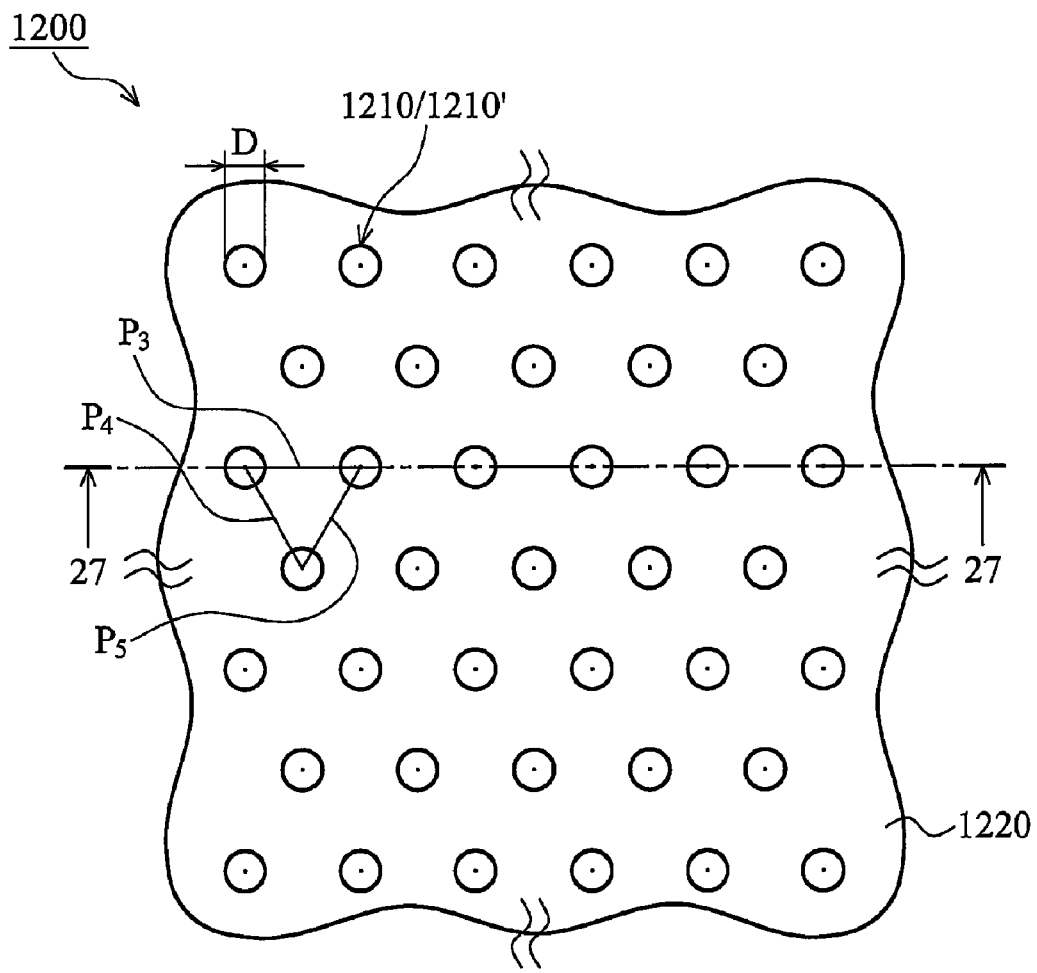
FIG. 26 is a schematic top view showing a photonic crystal structure according to an embodiment of the invention.
Figure 27:
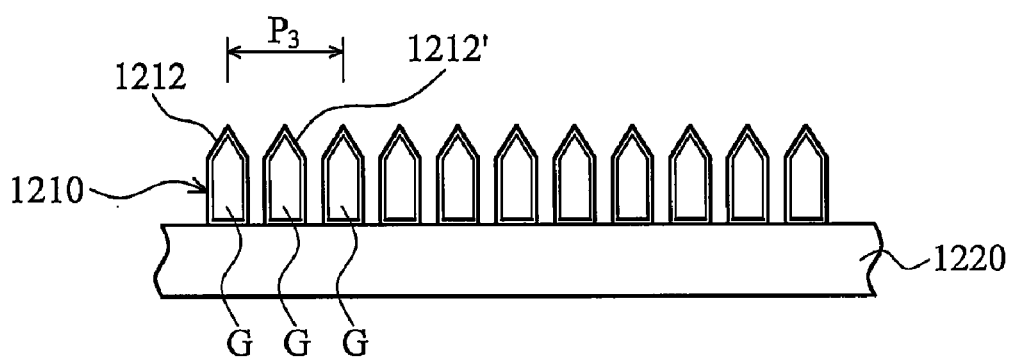
FIG. 27 is a schematic cross section taken along line 27-27 of FIG. 26.

FIGS. 26 and 27 are schematic diagrams showing an exemplary photonic crystal structure 1200 capable of applications of optical components and apparatuses such as waveguide, optical fiber, LED, light sources and omnidirectional reflectors. FIG. 26 shows a top view of the photonic crystal structure and FIG. 27 shows a schematic cross section taken along line 27-27 of FIG. 26.

In FIG. 26, the photonic crystal structure 1200 comprises a plurality of hollow stylus-shaped structures 1210/1210' formed over a substrate 1202, respectively having a space G therein. The hollow stylus-shaped structures 1210/1210' are formed with pitches $P_3$, $P_4$ and $P_5$ defined between every two tips 1212 of the hollow stylus-shaped structures 1210/1210'. These hollow stylus-shaped structures 1210/1210' can be formed by fabrications as illustrated in FIG. 2~6 and the substrate 1202 can be, for example, a semiconductor substrate.

As shown in FIG. 26, the pitches $P_3$, $P_4$ and $P_5$ are illustrated with a substantially same pitch and the hollow stylus-shaped structures 1210/1210' are arranged in substantially an array of perfect triangles. The hollow stylus-shaped structures 1210/1210' have a diameter D (of a column portion thereof) of about 0.1 μm and the pitches $P_3$, $P_4$ and $P_5$ are about 1~5 times that of the diameter D such as a value of 0.3 μm.

As shown in FIG. 27, a schematic cross section taken along line 27-27 of FIG. 26 is illustrated, showing a hollow stylus-shaped structure 1210' at a relative front row interposing between a pair of hollow stylus-shaped structures 1210 at a relative rear row.

In the MRAM device illustrated in FIG. 12 and the RRAM device illustrated in FIG. 13, a contact electrode with further reduced size can be achieved by incorporating the hollow stylus-shaped structures 110 as shown in FIG. 6, thereby providing contact electrodes with lower operation currents and predetermined current density. This benefits size reduction of the memory cell structures therein. In the FED device illustrated in FIG. 14, the multiple-electrobeam direct writing lithography apparatus illustrated in FIG. 15, and the high density data storage device illustrated in FIG. 16, an electron emitter and data writer with further reduced size can be achieved by incorporating the hollow stylus-shaped structures 110 as shown in FIG. 6, thereby providing better pixel performances and process ability within a fixed surface area and improve efficiencies and yields thereof. In the microscope apparatus illustrated in FIG. 17 and the lithography apparatus illustrated in FIG. 18 using the above microscope apparatus, a probe component and an exposure component with further reduced size can be achieved by incorporating the hollow stylus-shaped structures 110 as shown in FIG. 6, thereby improving sensitivities and photolighography abilities thereof. In the photonic structure illustrated in FIGS. 26 and 27, an optical component with further reduced size can be achieved by incorporating the hollow stylus-shaped structures 110 as shown in FIG. 6, thereby improving optical performances thereof.

FIGS. 19~25 are schematic diagrams respectively showing fabrications in various fabrication steps of another exemplary phase change memory device.

Figure 19:
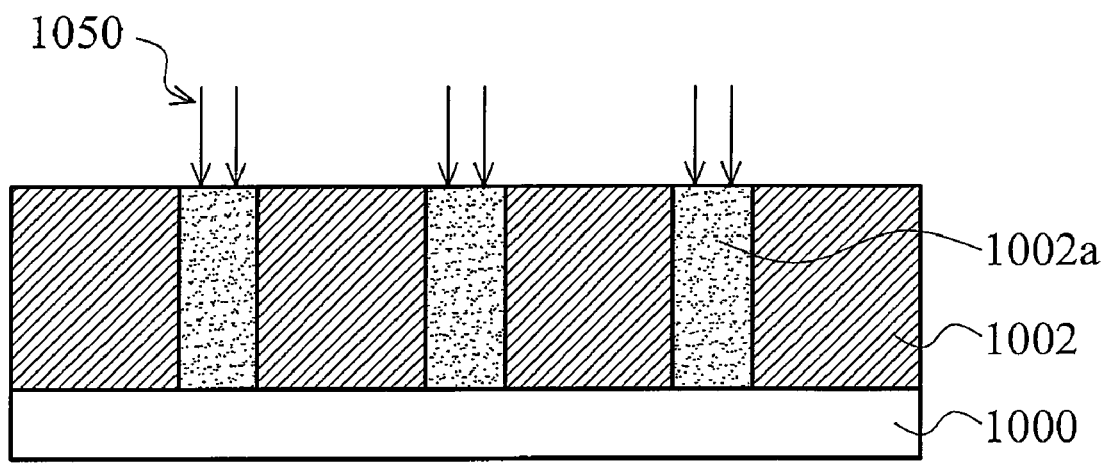
FIGS. 19~25 are schematic diagrams respectively showing fabrications in various fabrication steps of a phase change memory device according to another embodiment of the invention.

In FIG. 19, a conductive layer 1000 is provided. The conductive layer 1000 can be formed over a base structure such as an insulating layer or a substrate, but only the conductive layer 1000 is illustrated in FIG. 19, for simplicity. A resist layer 1002 is then coated over the conductive layer 1000. The resist layer 1002 comprises resist materials containing no silicon, such as chain scission resists which can be exposed by electro beam (E-beam) exposure or ion beam exposure, or chemically amplified resist (CAR) which can be exposed by deep ultraviolet (DUV) light or E-beam. Herein, the resist layer 1002 can be a ZEP-520A resist (a product of Zeon chemicals.) and is not limited thereto. The resist layer 1002 is coated with a thickness about 500~10000 Å.

In FIG. 19, an electron beam 1005 is provided to directly expose a portion of the resist layer 1002, thereby forming a plurality of exposed portions 1002a in the resist layer 1002. It's noted that while the resist layer 1002 adopts resist materials of other exposure types, the resist layer 1002 can be exposed in other methods such as a DUV exposed method and is not limited to the electro beam 1005 method.

Figure 20:
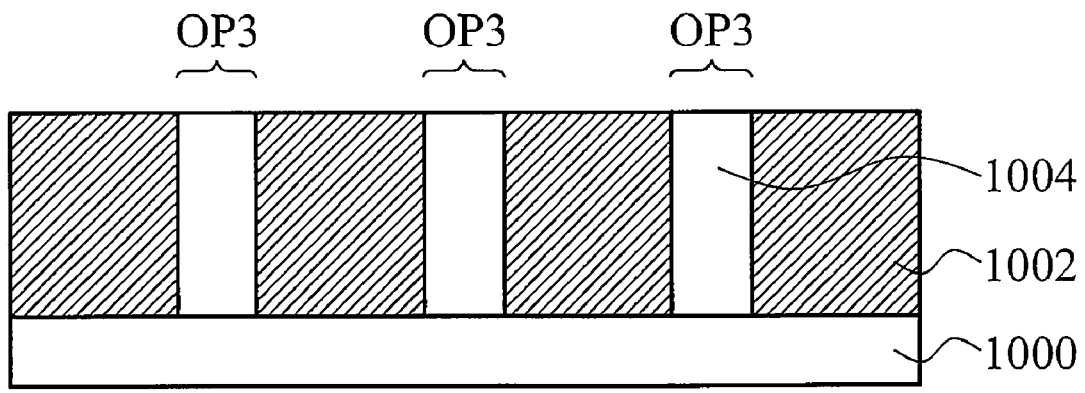

In FIG. 20, a development process (not shown) is performed to remove the exposed portions 1002a in the resist layer 1002, thereby forming a plurality of opening OP3 in the resist layer 102. Each of the opening OP3 exposes a part of the conductive layer 1000. Herein, the openings OP3 are formed with an aspect ration of about 1:1~10:1. Next, a spacer layer 1004 is spin coated over a surface of the resist layer 1002 and fills the openings OP3 under a rotational speed of about 2000~3000 rpm. Herein, the spacer layer 1004 substantially protrudes over a top surface of the resist layer 1002. Next, a dry or wet etching process (not shown) is performed to remove the portion of the spacer layer over the top surface of the resist layer 1002, thereby leaving a spacer layer 1004 in each of the openings OP3. The spacer layer 1004 has a top surface substantially the same as that of the resist layer 1002.

Herein, the spacer layer 1004 may comprise undiluted silicon-containing material such as silicon-containing organic or inorganic materials. In this embodiment, the undiluted silicon-containing material of the spacer layer 1004 comprises hydrogen silsesquixane (HSQ), which is not diluted by any solvent.

Figure 21:
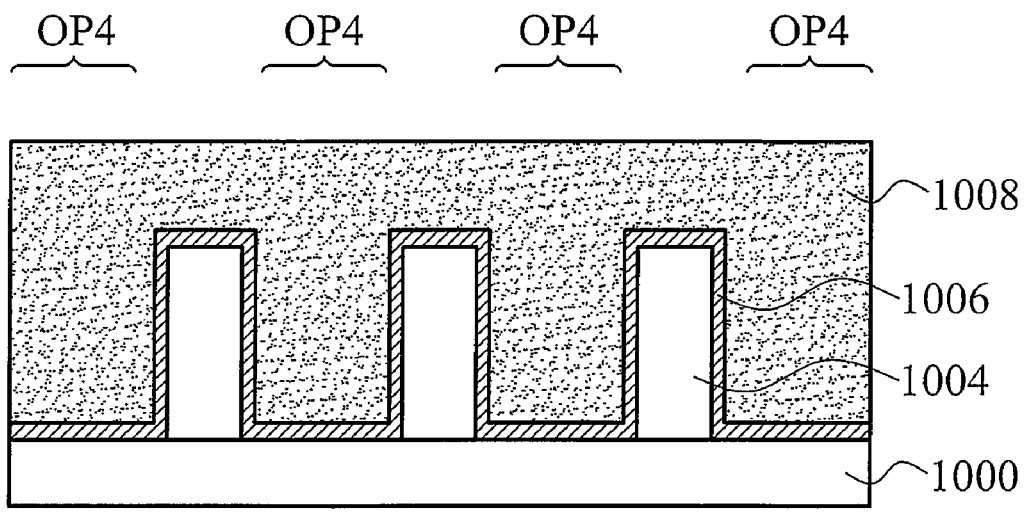

In FIG. 21, a dry etching process (not shown) is next performed to remove the resist layer 1002 ands leave a plurality of solid column structures (formed by the spacer layer 1004) over the conductive layer 1000. Next, a phase change material layer 206 is conformably formed over the conductive layer 1000, covering surfaces of the solid column structures. The phase change material layer 206 may comprise phase change materials such as chalcogenide materials such as Ge—Sb—Te trinary chalcogenide compound or Te—Sb binary chalcogenide compound. A planarization layer 1008 is then coated over the phase change material layer 1006 to obtain a planar surface. The planarization layer 1008 may comprise, for example, silicon-containing organic or inorganic materials such as undiluted HSQ. The planarization layer 1008 is formed with a thickness of about 300~4000 Å.

Figure 22:
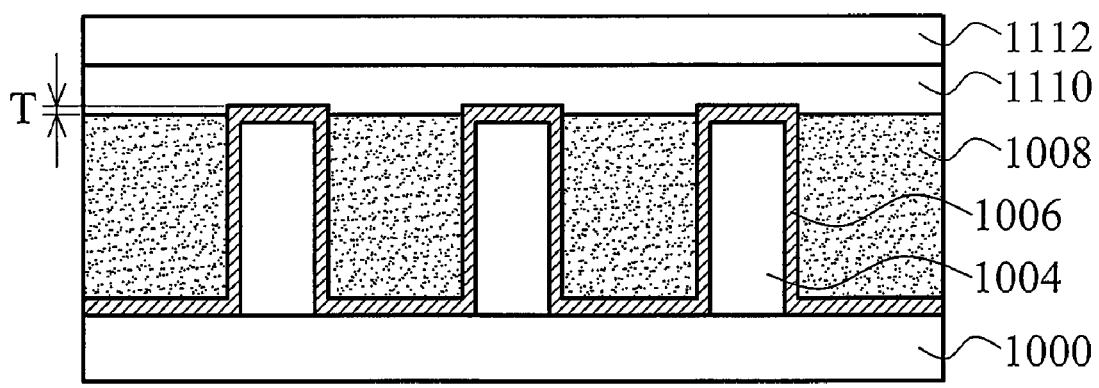

In FIG. 22, an etching process (not shown) is performed to remove the portion of the planarization layer 1008 above a top surface of the spacer layer 1004, thereby partially exposing the phase change material layer 1006 and leaving the planarization layer 1008 substantially lower or higher than the phase change material layer 1006, having a thickness difference T of about 100~300 Å therebetween. Next, conductive layers 1110 and 1112 are blanketly formed over the planarization layer 1008 in sequence, contacting with the phase change material layer 1006 exposed by the planarization layer 1008. Herein, the conductive layer 110 can be, for example, a TiW layer and the conductive layer 1112 can be, for example, a TaN layer. By the combination of the conductive layers 1110 and 1112, a hard mask layer is formed for the subsequent definition of the phase change material layer 1006 thereunder.

Figure 23:
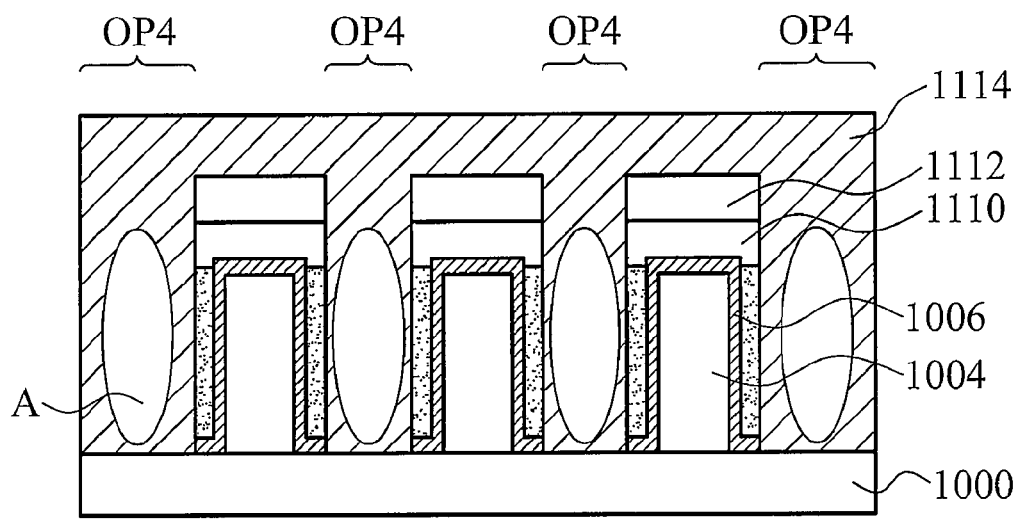

In FIG. 23, a photolithography and an etching process (both not shown) are then performed to define portions of the conductive layers 1112 and 1110, the phase change material layer 1006 and the planarization layer 1008, thereby forming a plurality of opening OP4 in the film layers between the solid column structures and forming a plurality of phase change memory (PCM) cell structures. The opening OP4 are formed with a pitch of about 200~5000 Å, depending on the designed cell density of the PCM device.

Figure 24:
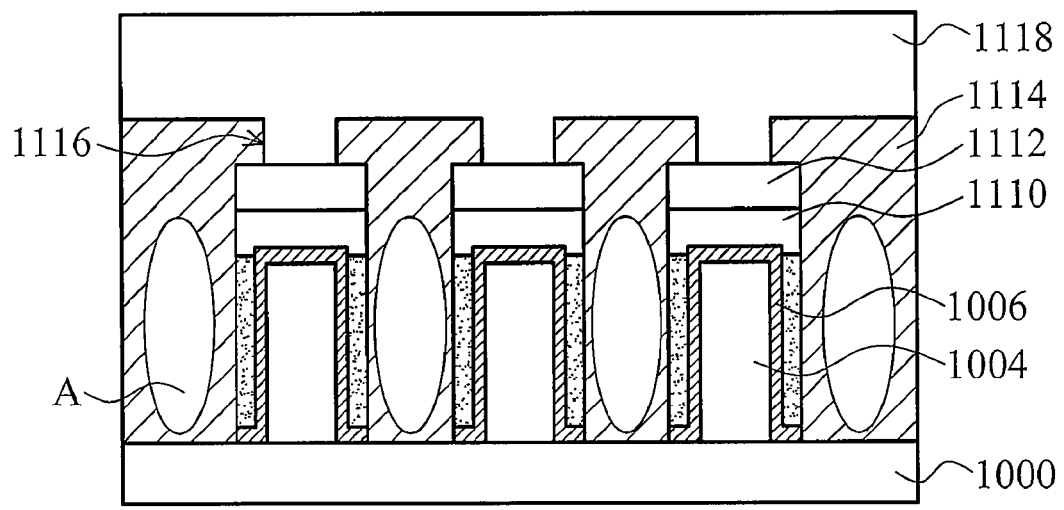

In FIG. 24, an interlayer dielectric layer 1114 is blanketly formed over the structure illustrated in FIG. 23. The interlayer dielectric layer 1114 can be formed by, for example, a plasma enhanced chemical vapor deposition process, performed under a temperature not more than 350° C. The interlayer dielectric layer 1114 may comprise, for example, silicon oxide, silicon nitride, or combination thereof. Herein, air gaps A are simultaneously formed during deposition of the interlayer dielectric layer 1114 since an aspect ratio between the phase change memory cell structures is greater than 1. Next, a photolithography and an etching process (both not shown) are performed to form a plurality of via holes 1116 in the interlayer dielectric layer 1116, and the via holes located at each of the PCM cell structures, respectively, exposing a top surface of the conductive layer 1112. A conductive layer 1118 is then blanketly deposited to cover the interlayer dielectric layer 1114. The conductive layer 1118 may comprise aluminum and a barrier layer (not shown) can be optionally provided between the conductive layer 1118 and the interlayer dielectric layer 1114. The barrier layer may comprise materials such as TiN or TaN.

Figure 25:
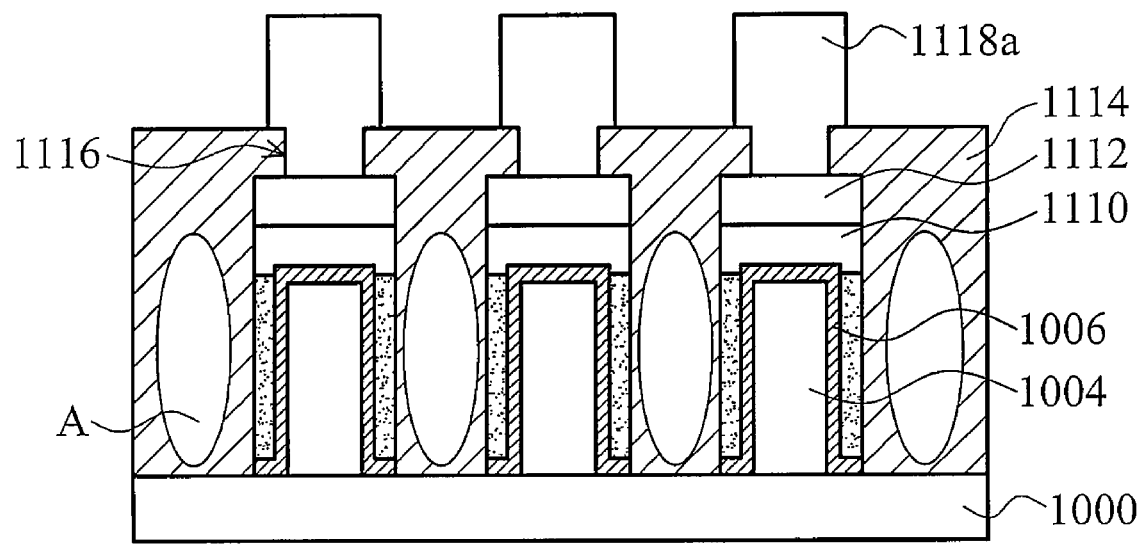

In FIG. 25, a photolithography and an etching process (both not shown) are performed to partially remove the conductive layer 1118 and leave a plurality of conductive elements 1118a over the PCM cell structures, respectively contacting the phase change material layer 1006 through the conductive layers 1112 and 1110.

Figure 1:
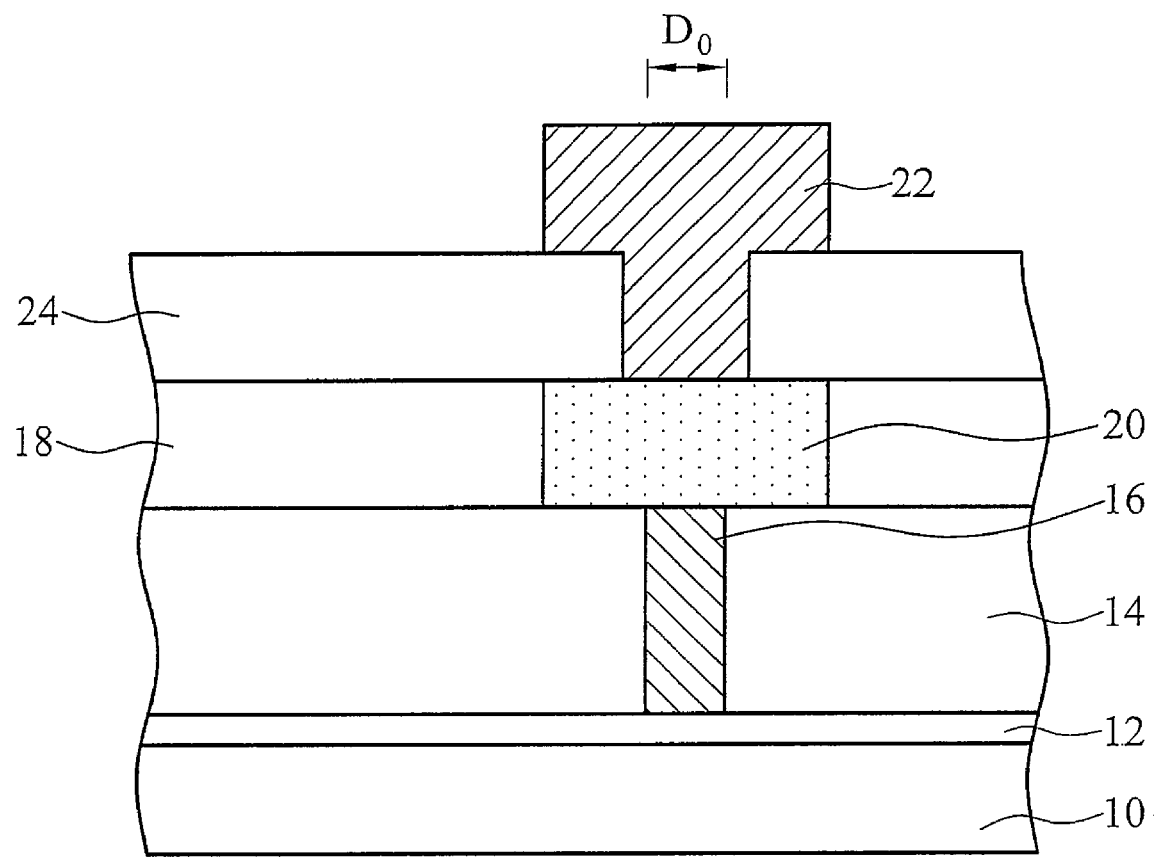
FIG. 1 is cross section of a conventional phase change memory cell structure.

In the PCM device as shown in FIG. 25, the phase change material layer 1004 covers the solid column structures in each of the PCM cell structures and a contact area between the phase change material layer 1004 and the overlying conductive layer 1110 and the underlying conducive layer 1110 can be changed by adjusting a thickness thereof. Fabrication of the PCM device as shown in FIG. 25 is thus not restricted by photolithography techniques used therein as that occurring for fabrication of the conventional PCM device, as illustrated in FIG. 1, thereby lowering operation currents and maintaining current density of the PCM device. In addition, since the interlayer dielectric layer 1114 adjacent to each of the PCM cell structures is formed with air gaps A therein, the phase change material layer 1006 is thereby provided with heat insulation during heating thereof, improving heating efficiency of the heating electrode, and preventing heat diffusion within the PCM cell structures.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A hollow stylus-shaped structure, comprising:
a hollow column spacer formed over a base layer;
a hollow cone spacer stacked over the hollow column spacer; and
a conductive layer conformably formed over a surface of the hollow column spacer, the hollow cone spacer, and the base layer adjacent to the hollow column spacer;
wherein the hollow cone spacer, the hollow column spacer, and the base layer form a space, and sidewalls of the hollow cone spacer and the hollow column spacer are made of silicon-containing organic or inorganic materials.

2. The hollow stylus-shaped structure as claimed in claim 1, wherein the base layer is a dielectric layer, a conductive layer, or a part of a substrate.

3. The hollow stylus-shaped structure as claimed in claim 1, wherein the hollow column spacer has a fixed diameter of about 300~2000 Å.

4. The hollow stylus-shaped structure as claimed in claim 1, wherein the hollow cone spacer has a diameter less than 100 Å at a minimum upper part thereof and the diameter increases from top to bottom of the hollow cone spacer to a diameter the same as that of the column spacer.

5. The hollow stylus-shaped structure as claimed in claim 1, wherein the hollow column spacer has a first height and the hollow cone spacer has a second height, and the first and second heights have a ratio of about 1:1~4:1.

6. The hollow stylus-shaped structure as claimed in claim 1, wherein the sidewalls of the hollow column spacer and the hollow cone spacer have a thickness less than 25 nanometer.

7. A phase change memory (PCM) device, comprising:
a hollow stylus-shaped structure, comprising:
a hollow column spacer formed over a base layer, wherein the base layer is a first conductive layer; and
a hollow cone spacer stacked over the hollow column spacer;
wherein the hollow cone spacer, the hollow column spacer, and the base layer form a space, and sidewalls of the hollow cone spacer and the hollow column spacer are made of silicon-containing organic or inorganic materials;
a second conductive layer conformably formed over a surface of the hollow stylus-shaped structure and portions of the first conductive layer adjacent to the hollow stylus-shaped structure;
a first dielectric layer partially covering the second conductive layer, exposing the second conductive layer over a tip portion of the hollow cone spacer of the hollow stylus-shaped structure;
a phase change material layer formed over the first dielectric layer, contacting with the second conductive layer formed over the tip portion of the hollow cone spacer of the hollow stylus-shaped structure; and
a third conductive layer formed over the phase change material layer.

8. The PCM device as claimed in claim 7, further comprising a second dielectric layer formed over the phase change material layer to cover the phase change material layer, the first dielectric layer, the second conductive layer and the hollow stylus-shaped structure, and the third conductive layer is partially embedded within the second dielectric to partially cover the second dielectric layer.

9. The PCM device as claimed in claim 7, further comprising an air gap formed in the second dielectric layer and the air gap is adjacent to the second conductive layer, the dielectric layer, and the phase change material layer.

10. The PCM device as claimed in claim 7, wherein the second conductive layer over the tip portion of the hollow cone spacer of the hollow stylus-shaped structure has a thickness of about 5~100 nanometer.

11. The PCM device as claimed in claim 7, wherein the phase change material layer comprises chalcogenide materials.

12. A magnetic random access memory (MRAM) device, comprising:
a hollow stylus-shaped structure, comprising:
a hollow column spacer formed over a base layer, wherein the base layer is a first conductive layer; and
a hollow cone spacer stacked over the hollow column spacer;
wherein the hollow cone spacer, the hollow column spacer, and the base layer form a space, and sidewalls of the hollow cone spacer and the hollow column spacer are made of silicon-containing organic or inorganic materials;
a second conductive layer is conformably formed over a surface of the hollow stylus-shaped structure and parts of the first conductive layer adjacent to the hollow stylus-shaped structure;
a first dielectric layer partially covers the conductive layer, exposing the second conductive layer covering a tip portion of the hollow cone spacer of the hollow stylus-shaped structure;
a stacked structure formed over the first dielectric layer comprises a free layer, a spacer layer, and a pinned layer sequentially stacked over the first dielectric layer, wherein the free layer covers the second conductive layer over the tip portion of the hollow cone spacer of the hollow stylus-shaped structure; and
a third conductive layer formed over the stacked structure.

13. A resistive random access memory (RRAM) device, comprising:
a hollow stylus-shaped structure, comprising:
a hollow column spacer formed over a base layer, wherein the base layer is a first conductive layer; and
a hollow cone spacer stacked over the hollow column spacer;
wherein the hollow cone spacer, the hollow column spacer, and the base layer form a space, and sidewalls of the hollow cone spacer and the hollow column spacer are made of silicon-containing organic or inorganic materials;
a second conductive layer conformably formed over a surface of the hollow stylus-shaped structure and parts of the first conductive layer adjacent to the hollow stylus-shaped structure;
a first dielectric layer partially covering the conductive layer, exposing the second conductive layer covering a tip portion of the hollow cone spacer of the hollow stylus-shaped structure;
a metal oxide layer formed over the first dielectric layer, wherein the metal oxide layer covers the second conductive layer over the tip portion of the hollow cone spacer of the hollow stylus-shaped structure; and
a third conductive layer formed over the stacked structure.

14. A filed emission display (FED) device, comprising:
a plurality hollow stylus-shaped structures, each comprising:
   a hollow column spacer formed over a shared base layer, wherein the shared base layer is a cathode layer formed over a first substrate; and
   a hollow cone spacer stacked over the hollow column spacer;
   wherein the hollow cone spacer, the hollow column spacer, and the shared base layer form a space, and sidewalls of the hollow cone spacer and the hollow column spacer are made of silicon-containing organic or inorganic materials;
a conductive layer conformably formed over a surface of the hollow stylus-shaped structures and the cathode layer, wherein the conductive layer formed over the hollow stylus-shaped structures are electrically isolated;
a second substrate with an anode layer thereon oppositely disposed to the first substrate; and
a plurality of fluorescence layers disposed over the anode layer, substantially aligning to one of the hollow stylus-shaped structures covered by the conductive layer.

15. A multiple-electrobeam direct writing lithography apparatus, comprising:
a plurality hollow stylus-shaped structures, each comprising:
   a hollow column spacer formed over a shared base layer, wherein the shared base layer is a semiconductor layer formed over a support substrate; and
   a hollow cone spacer stacked over the hollow column spacer;
   wherein the hollow cone spacer, the hollow column spacer, and the shared base layer form a space, and sidewalls of the hollow cone spacer and the hollow column spacer are made of silicon-containing organic or inorganic materials; and
a conductive layer conformably formed over a surface of the hollow stylus-shaped structures and the semiconductor layer, wherein the conductive layer formed over the hollow stylus-shaped structures and the semiconductor layer are electrically isolated.

16. A high density magnetic storage device, comprising:
a probe layer;
a cantilever connected with the probe layer;
a hollow stylus-shaped structure formed over an end of the cantilever, comprising:
   a hollow column spacer formed over a base layer, wherein the base layer is the cantilever; and
   a hollow cone spacer stacked over the hollow column spacer;
   wherein the hollow cone spacer, the hollow column spacer, and the base layer form a space, and sidewalls of the hollow cone spacer and the hollow column spacer are made of silicon-containing organic or inorganic materials; and
a conductive layer conformably covering a surface of the cantilever and the hollow stylus-shaped structure, wherein the hollow stylus-shaped structure covered by the conductive layer acts as a writing component.

17. A microscope apparatus, comprising:
a Z-axis direction positioning sensor;
a cantilever connected with the Z-axis direction positioning sensor;
a hollow stylus-shaped structure formed over an end of the cantilever, comprising:
   a hollow column spacer formed over a base layer, wherein the base layer is the cantilever; and
   a hollow cone spacer stacked over the hollow column spacer;
   wherein the hollow cone spacer, the hollow column spacer, and the base layer form a space, and sidewalls of the hollow cone spacer and the hollow column spacer are made of silicon-containing organic or inorganic materials;
a layer conformably covering a surface of the cantilever and the hollow stylus-shaped structure, wherein the layer comprises a material selected from the group consisting of SiOx, SiNx, and tungsten;
an X-Y-axis direction positioning sensor; and
a substrate disposed over the X-Y-axis direction positioning sensor,
wherein the hollow stylus-shaped structure covered by the layer acts as a probe for measuring a surface profile of a sample disposed over the substrate.

18. A lithography apparatus, comprising:
a Z-axis direction positioning sensor;
a cantilever connected with the Z-axis direction positioning sensor;
a hollow stylus-shaped structure formed over an end of the cantilever, comprising:
   a hollow column spacer formed over a base layer, wherein the base layer is the cantilever; and
   a hollow cone spacer stacked over the hollow column spacer;
   wherein the hollow cone spacer, the hollow column spacer, and the base layer form a space, and sidewalls of the hollow cone spacer and the hollow column spacer are made of silicon-containing organic or inorganic materials;
a layer conformably covering a surface of the cantilever and the hollow stylus-shaped structure, wherein the layer comprises a material selected from the group consisting of W/ZrOx, W, LaB6, Pt, Au, carbon, and carbon nanotube (CNT);
an X-Y-axis direction positioning sensor;
a substrate disposed over the X-Y-axis direction positioning sensor, having a resist layer formed thereon; and
a power supply, wherein a positive terminal is connected with the substrate and a negative terminal is connected with the layer;
wherein the hollow stylus-shaped structure covered by the resist layer acts as an exposing component to pattern the resist layer.

19. A phase change memory (PCM) device, comprising:
a first conductive layer;
a plurality of solid pillars formed over the first conductive layer, wherein the solid pillars comprise silicon-containing organic or inorganic materials;
a phase change material layer conformably formed over a surface of the solid pillars; a second conductive layer formed over a top surface of the phase change material layer;
a first dielectric layer disposed between the solid pillars, covering the first conductive layer and portions of the second conductive layer; and
a third conductive layer formed over the first conductive layer and through the first dielectric layer, contacting with the second conductive layer.

20. The PCM device as claimed in claim 19, further comprising an air gap formed in the first dielectric layer and adjacent to the phase change material layer.

21. The PCM device as claimed in claim 19, wherein the phase change material layer has a thickness of about 3~200 nm.

22. The PCM device as claimed in claim 19, wherein the phase change material layer comprises chalcogenide materials.

23. A photonic crystal structure, comprising:
- a substrate; and
- a plurality hollow stylus-shaped structures formed over the substrate, each comprising:
  - a hollow column spacer formed over a base layer; and
  - a hollow cone spacer stacked over the hollow column spacer;
- wherein the hollow cone spacer, the hollow column spacer, and the base layer form a space, and sidewalls of the hollow cone spacer and the hollow column spacer are composed of silicon-containing organic or inorganic materials;
- wherein the hollow stylus-shaped structures are arranged with a substantially same pitch therebetween.

24. The photonic crystal structure as claimed in claim 23, wherein the hollow stylus-shaped structures are arranged as a top view of a substantially triangle configuration.

25. The photonic crystal structure as claimed in claim 23, wherein a pitch between the hollow stylus-shaped structures is about 1~5 times that of a diameter of a column portion of the hollow stylus-shaped structures.

* * * * *